(12) United States Patent
Tsuda et al.

(10) Patent No.: US 11,017,824 B2
(45) Date of Patent: May 25, 2021

(54) SEMICONDUCTOR DEVICE, CONTROL DEVICE AND CONTROL METHOD

(71) Applicant: RENESAS ELECTRONICS CORPORATION, Tokyo (JP)

(72) Inventors: Tetsuji Tsuda, Tokyo (JP); Yutaka Funabashi, Tokyo (JP); Teruki Fukuyama, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 74 days.

(21) Appl. No.: 16/585,858

(22) Filed: Sep. 27, 2019

(65) Prior Publication Data

US 2020/0152248 A1    May 14, 2020

(30) Foreign Application Priority Data

Nov. 9, 2018   (JP) ............................. JP2018-211087

(51) Int. Cl.
| | |
|---|---|
| *H02P 1/00* | (2006.01) |
| *H02P 27/08* | (2006.01) |
| *G11C 7/22* | (2006.01) |
| *G11C 11/4096* | (2006.01) |
| *G11C 7/10* | (2006.01) |

(52) U.S. Cl.
CPC .............. *G11C 7/222* (2013.01); *G11C 7/109* (2013.01); *G11C 7/1072* (2013.01); *G11C 7/1096* (2013.01); *G11C 11/4096* (2013.01); *H02P 1/00* (2013.01); *H02P 27/08* (2013.01)

(58) Field of Classification Search
CPC .................................. H02P 1/00; H02P 27/08
USPC .......................................................... 318/560
See application file for complete search history.

(56) References Cited

U.S. PATENT DOCUMENTS

| | | | | |
|---|---|---|---|---|
| 4,704,569 A | * | 11/1987 | Mallick, Jr. .............. | H02P 25/03 318/718 |
| 5,233,276 A | * | 8/1993 | Gleim ...................... | H02P 23/20 318/105 |
| 6,381,406 B1 | * | 4/2002 | Smith .................... | H02P 23/186 318/799 |
| 10,205,416 B2 | | 2/2019 | Furukawa et al. | |
| 2002/0059004 A1 | * | 5/2002 | Matsui .................... | G06F 1/025 700/39 |
| 2006/0064609 A1 | * | 3/2006 | Bryan ...................... | H03K 7/08 714/700 |

FOREIGN PATENT DOCUMENTS

WO     2016/135840 A1    9/2016

* cited by examiner

*Primary Examiner* — Bentsu Ro
(74) *Attorney, Agent, or Firm* — McDermott Will & Emery LLP

(57) ABSTRACT

An interference of control signals is caused by a deviation in the start timings of counting between counters of timer counter units of a first MCU and a second MCU. And thus, when a count value of the counter of the MCU of a parent reaches a predetermined value D, the MCU of the parent transmits a trigger signal to the MCU of a child. The MCU of the child obtains the time difference between the start timings of the counts of the counters of the parent and the child from the difference between the D and a count value E of the child at that time. A count period of the child until a maximum value of the count value is reached is adjusted by the time difference.

17 Claims, 30 Drawing Sheets

SEMICONDUCTOR DEVICE, CONTROL DEVICE AND CONTROL METHOD

CROSS-REFERENCE TO RELATED APPLICATIONS

The disclosure of Japanese Patent Application No. 2018-211087 filed on Nov. 9, 2018 including the specification, drawings and abstract is incorporated herein by reference in its entirety.

BACKGROUND

The present disclosure relates to a semiconductor device and is applicable to, for example, the semiconductor device for controlling an electric motor.

Generally, a microcontroller (MCU) includes a timer counter unit. The timer counter unit includes a counter for counting the number of signals (events) input at arbitrary intervals, indicating the number of clock, or indicating the elapse of time by counting signals input at regular intervals, a compare register for set a numerical value to be compared with the count value of the counter, and a capture register for capturing the count value of the counter at that time by a signal input from the outside. By using the compare register, when the set value and the count value coincide with each other, the output is changed. By using this operation, it is possible to change the signal, for example, it is possible to generate and output a pulsed signal or a PWM (Pulse Width Modulation) signal.

For example, a disclosure of the background is WO 2016/135840.

SUMMARY

Control signals generated by timer counter units of a plurality of MCUs interfere with each other due to switching noise. The interference of the control signal due to the switching noise means that, for example, when an output terminal voltage of the control signal of a first MCU is at the high level, and when an output terminal voltage of a control signal of a second MCU changes from the high level to the low level, the interference of the signal that the output terminal voltage of the first MCU momentarily changes to the low level occurs. The interference of the control signal is caused by, for example, a deviation in the start timing of counting between a counter of the timer counter unit of the first MCU and a counter of the timer counter unit of the second MCU. This occurs when software programs executed by two central processing devices (Central Processing Unit: hereinafter referred to as CPU) are different or the clocks of the two CPUs are different. Other objects and novel features will become apparent from the description of this disclosure and the accompanying drawings.

The typical aspects of the present disclosure will be briefly described below. That is, a semiconductor device comprises a first device has a first counter that periodically counts the clock number of the clock signal to a first predetermined value. And the first device generates and outputs a control signal using the count value of the first counter, a second predetermined value and a third predetermined value, and outputs a first trigger signal when the count value of the first counter reaches a fourth predetermined value. A second device has a second counter that periodically counts the clock number of the clock signal to the first predetermined value, and to generate and output a control signal using the count value of the second counter, the second predetermined value and the third predetermined value. The second device determines a difference between the count value of the first counter and the count value of the second counter when the first trigger signal is inputted, and adjusts a count period (count cycle) of the second counter based on the difference.

According to the above semiconductor device, the deviation of the control signals due to the deviation of the start timings of the counts of the counters can be reduced.

DETAILED DESCRIPTION

Figure 1:
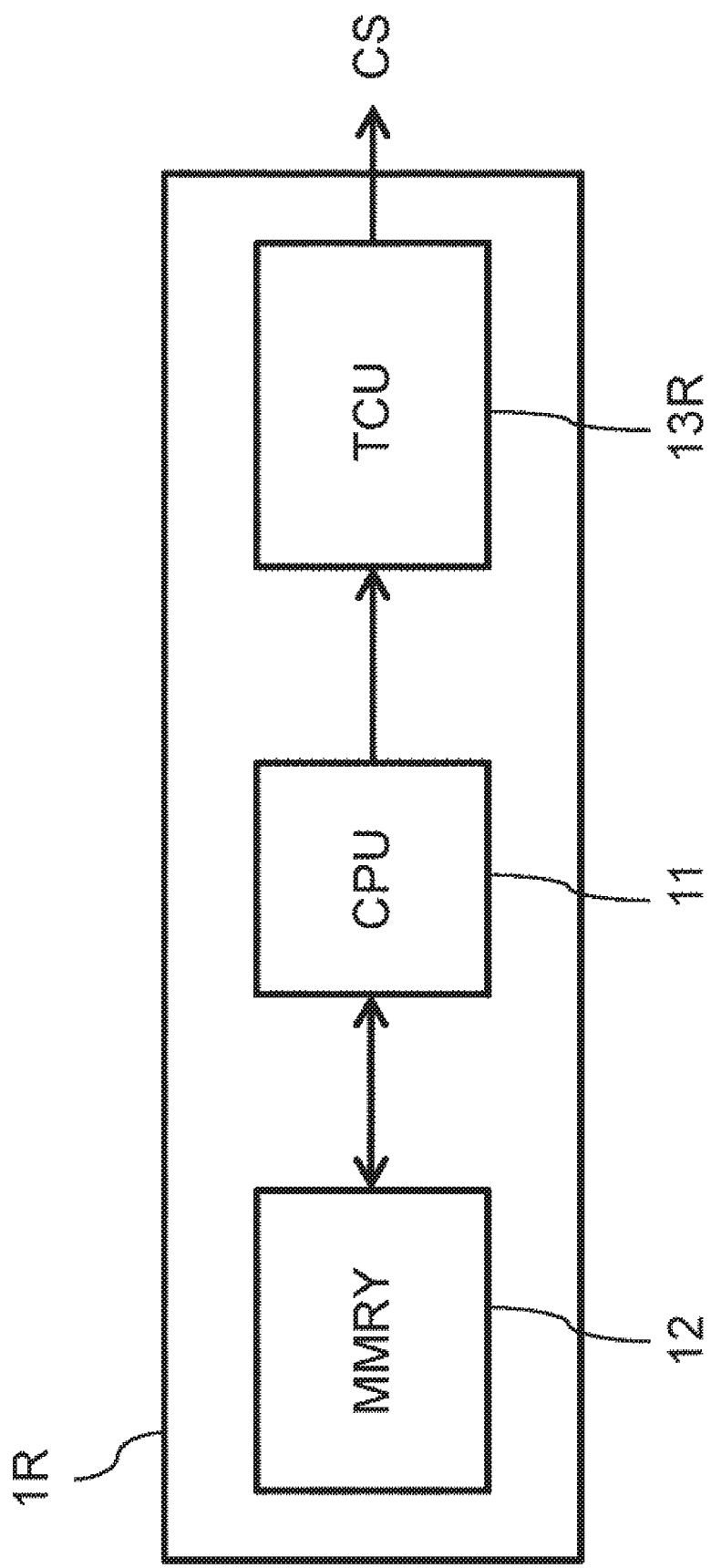
FIG. 1 is a block diagram showing a configuration of an MCU.

Embodiments and modified examples will be described below with reference to drawings. However, in a following description, the same components are denoted by the same reference numerals, and a repetitive description thereof may be omitted.

Figure 2:
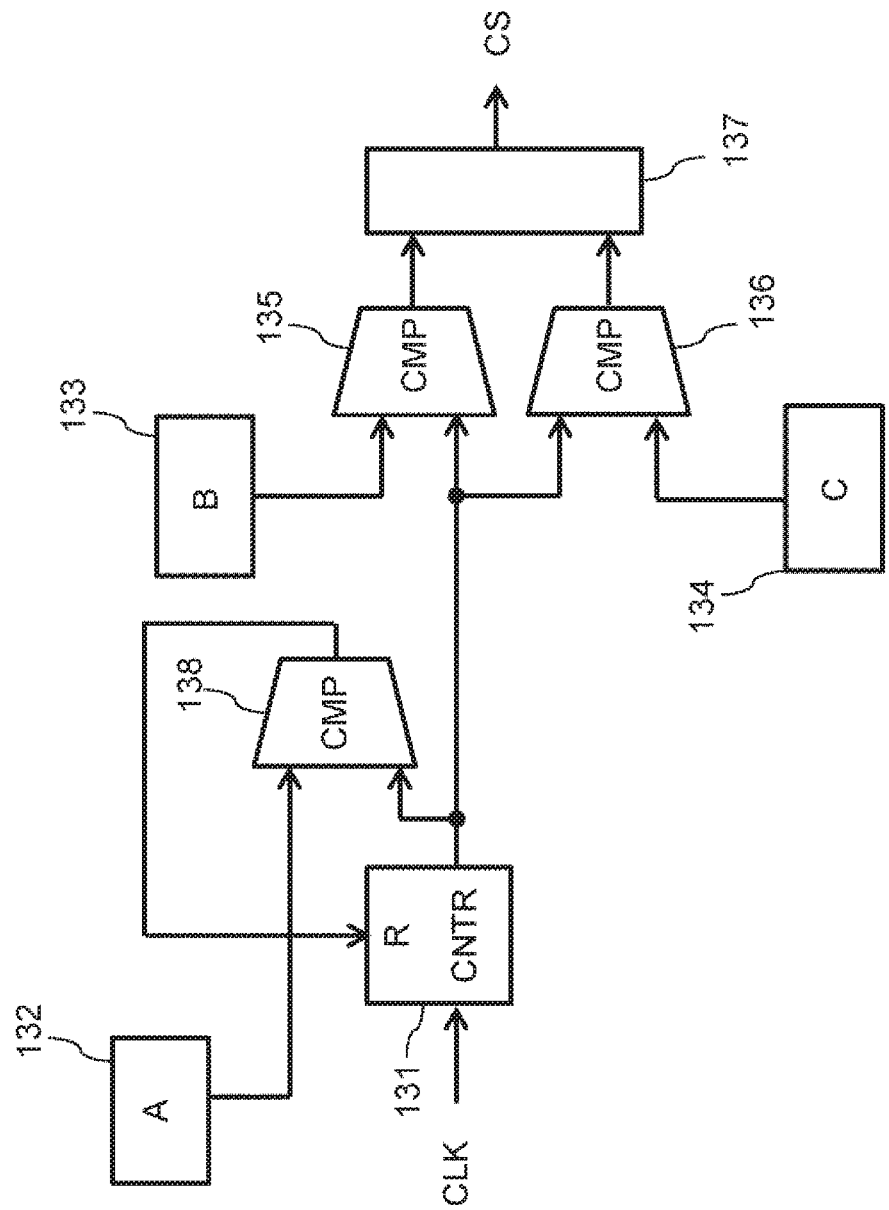
FIG. 2 is a block diagram illustrating a configuration of a timer counter unit of FIG. 1.
Figure 3:
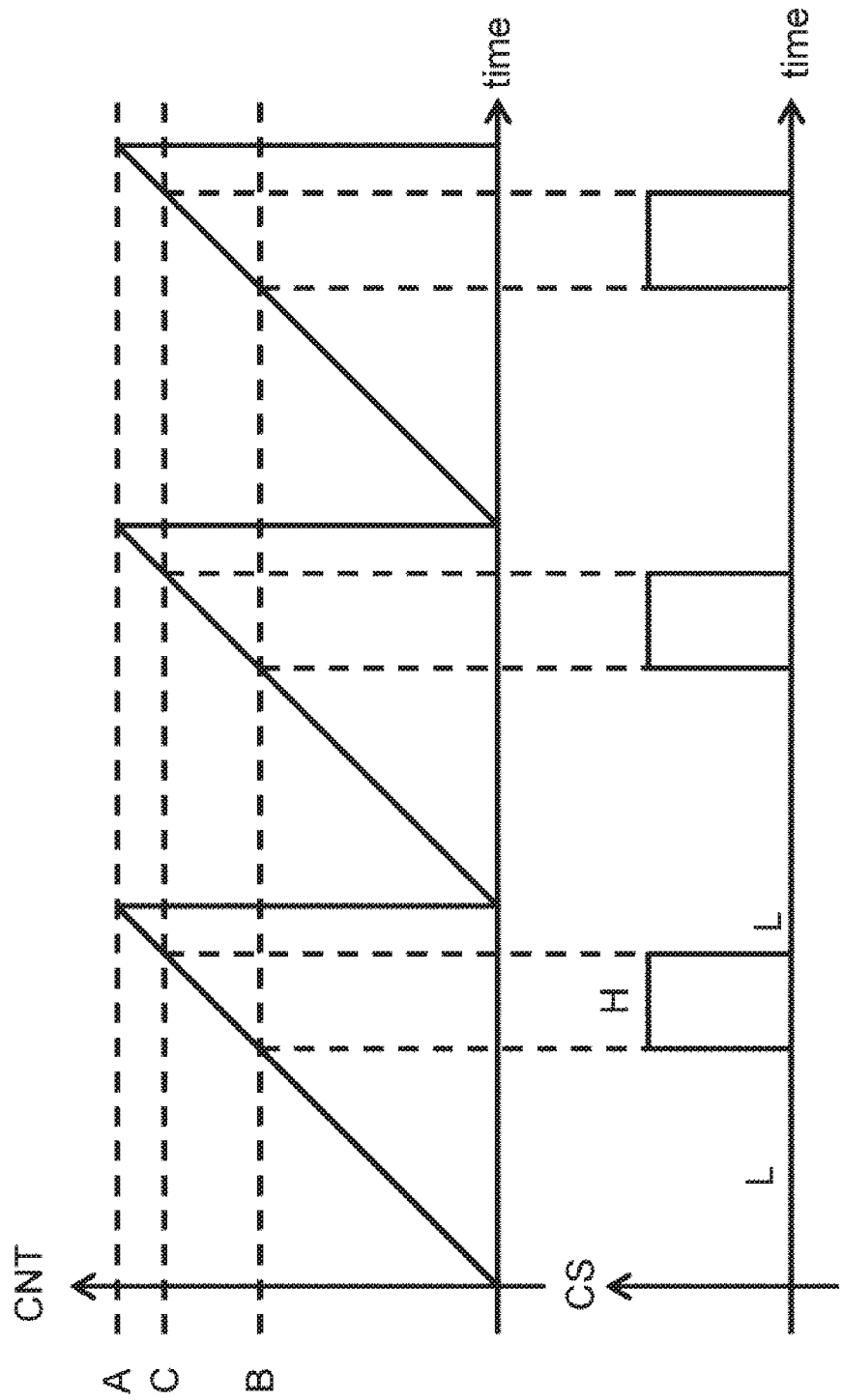
FIG. 3 is a diagram illustrating waveforms of a counter and a control signal.
Figure 4:
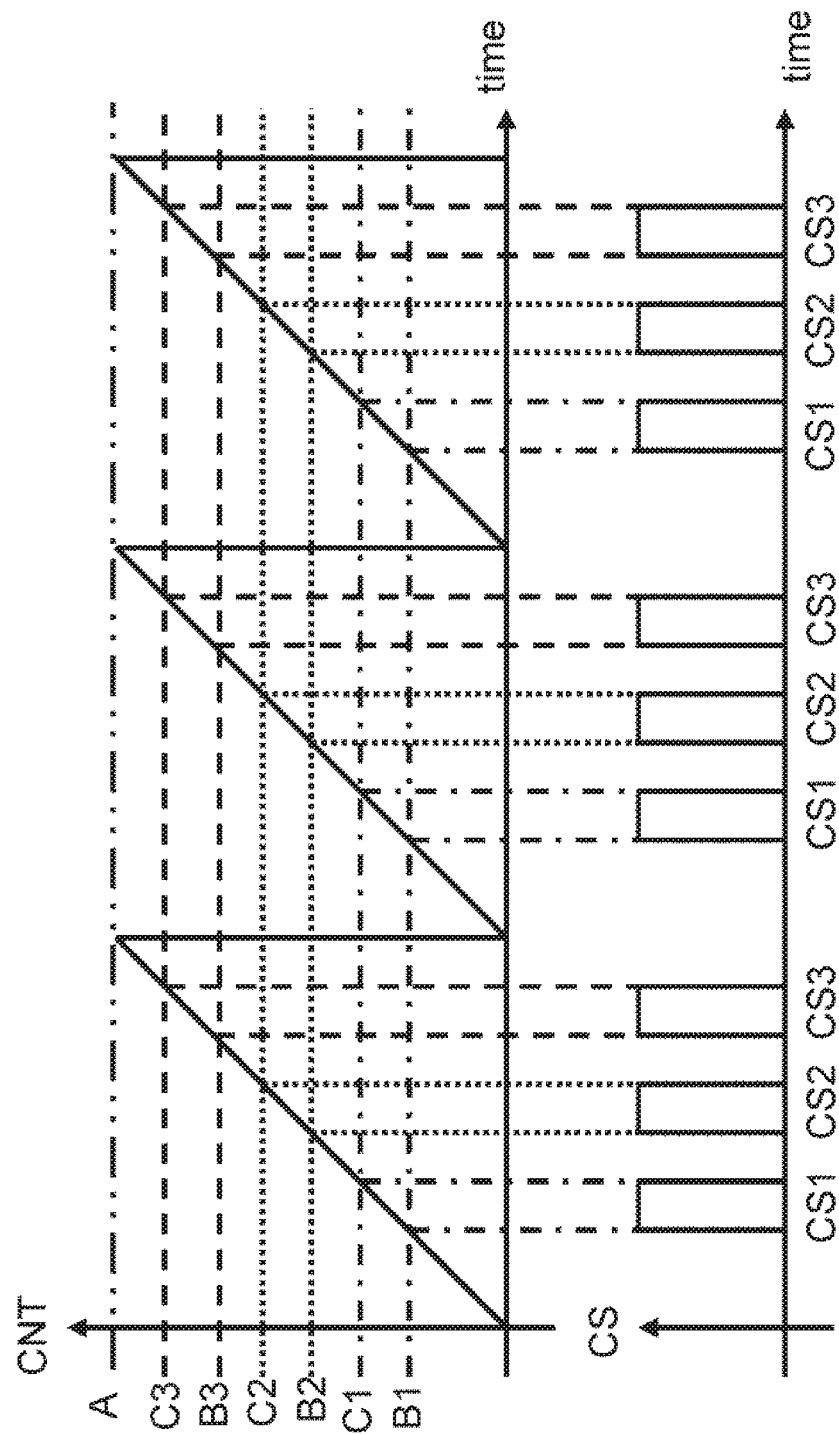
FIG. 4 is a diagram illustrating waveforms of a plurality of control signals.

First, a generation of a control signal by a timer counter will be described with reference to FIGS. 1 to 3. FIG. 1 is a block diagram showing a configuration of an MCU. FIG. 2 is a block diagram showing a configuration of a timer counter unit of FIG. 1. FIG. 3 is a diagram illustrating waveforms of control signals. FIG. 4 is a diagram illustrating waveforms of a plurality of control signals.

As shown in FIG. 1, an MCU 1 as a control unit includes a CPU 11, a memory (MMRY) 12 for storing a software program and the like, and a timer counter unit (TCU) 13R.

As shown in FIG. 2, the timer counter unit 13R includes a counter (CNTR) 131 that counts up by a clock signal (CLK), registers 132, 133, and 134, comparators (CMPs) 135, 136, and 138, and an edge-detecting circuit 137. The registers 133 and 134 are so-called compare registers.

A is a value giving the count period (count cycle), and B and C are values related to a duty ratio. The values of A, B, and C are set in the registers 132, 133, and 134. As shown in FIG. 3, the counter (CNTR) 131 counts up the count value (CNT) from 0, returns to 0 when the count value (CNT) reaches A, and counts up again. That is, the counter 131 is a free-running counter in the cycle A. Further, as illustrated in FIG. 2 and FIG. 3, the comparator 135 compares the count value (CNT) of the counter 131 with the indicated value (B) in the timer counter unit 13, and the control signal (CS) is an output L when the count value (CNT) of the counter 131 is smaller, and the control signal (CS) is an output H when the count value (CS) is larger. In addition, the comparator 136 compares the count value (CNT) of the counter 131 with the indicated value (C), and the control signal (CS) is an output H when the count value (CNT) of the counter 131 is smaller, and the control signal (CS) is an output L when the count value (CS) is larger. As a result, in the control signal (CS), L is the output when 0<CNT<B, H is the output when B<CNT<C, and L is the output when C<CNT<A, and this output continues repeatedly. Where A gives the count period and C−B determines the duty ratio. Accurately, the count period is determined by the period×A of the original clock, and (C−B)/A represents the duty ratio.

The CPU 11 applies the values A, B, and C to the registers 132, 133, and 134 of the timer counter unit 13R, thereby starts counting of the counter 131 and outputs the control signal CS.

By providing a plurality of sets of registers 133 and 134 and comparators 135 and 136, for example, three sets, and setting A, B1, C1, B2, C2, B3, and C3, a plurality of control signals (CS1, CS2, CS3) can be outputted based on the count value (CNT) of one counter 131, as shown in FIG. 4.

Figure 5:
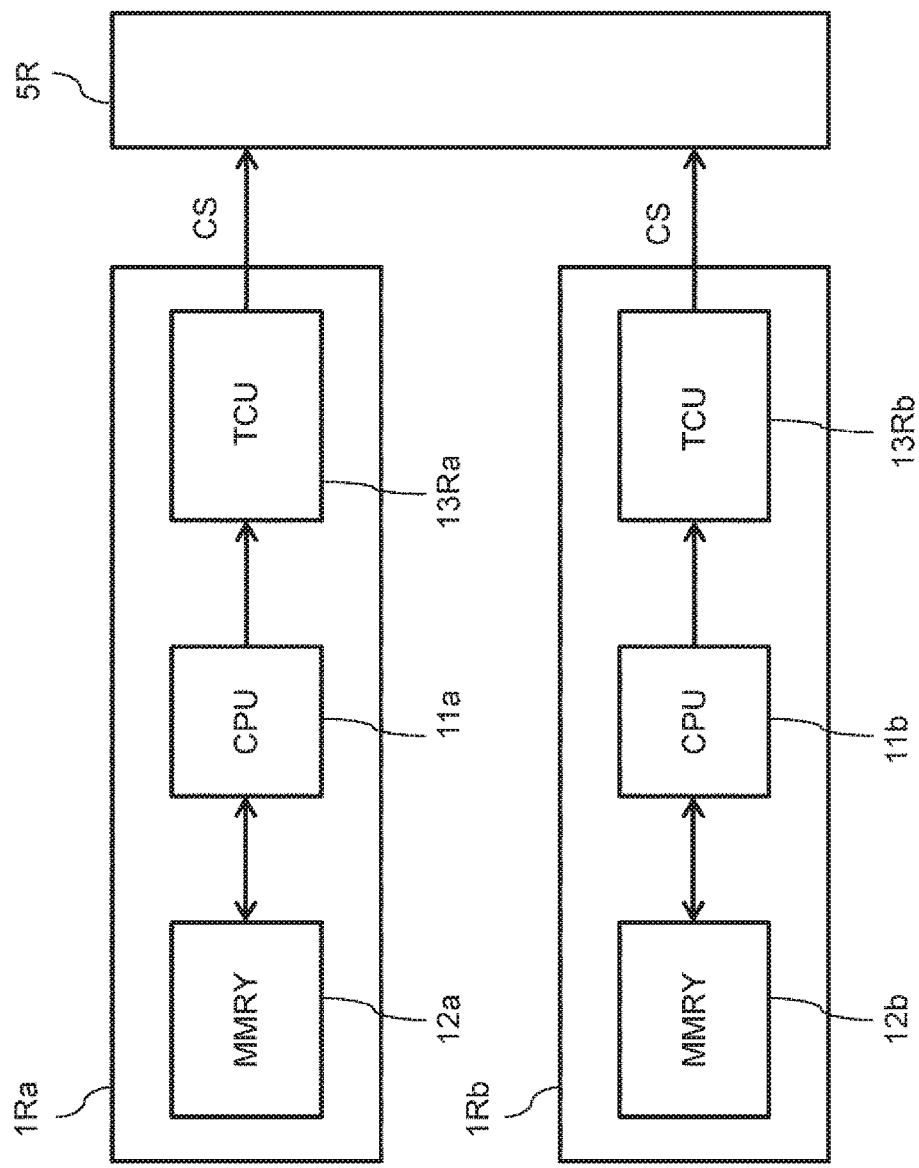
FIG. 5 is a diagram illustrating a redundant control unit.
Figure 6:
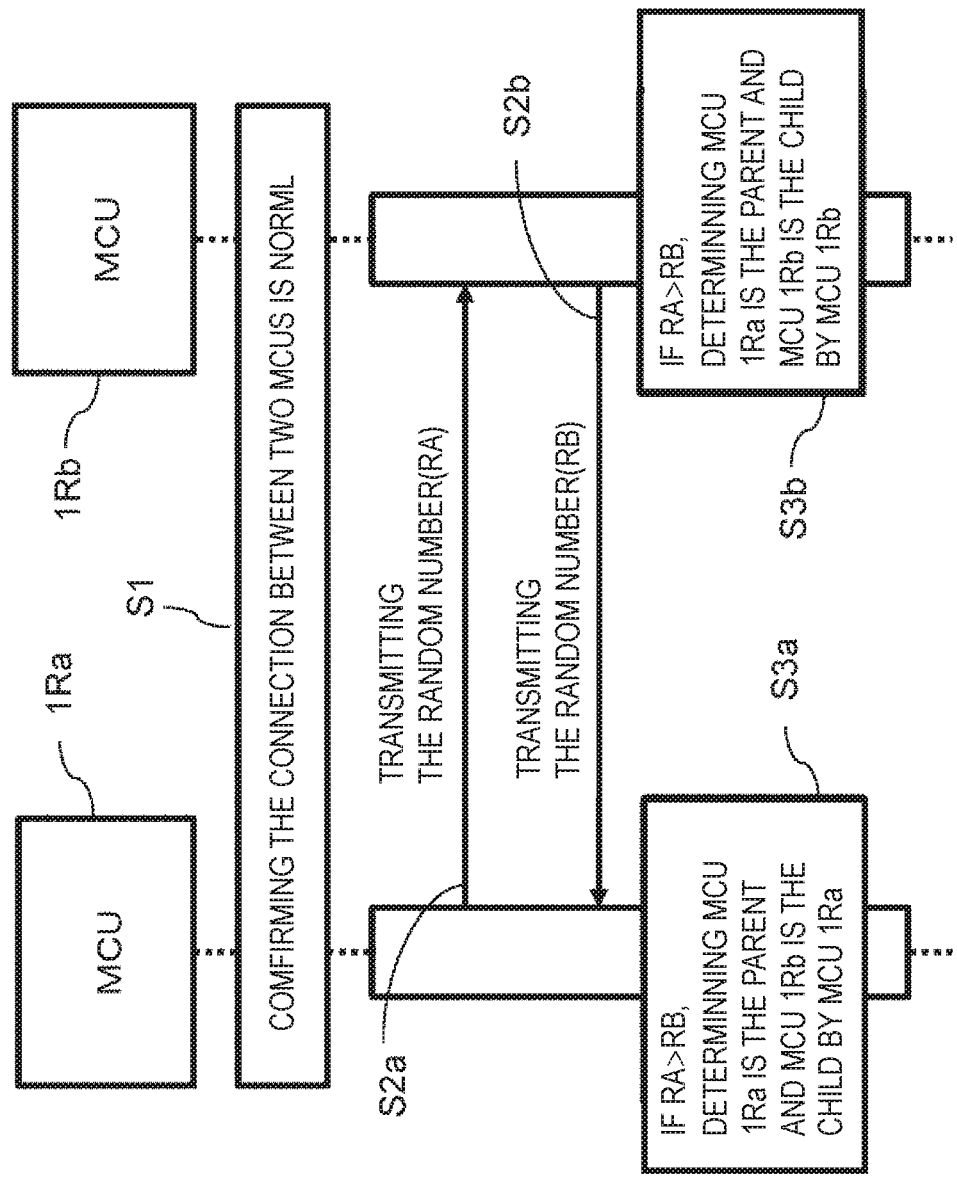
FIG. 6 is a sequence diagram of a parent-child determination of the control unit of FIG. 5.

Next, the redundant control device will be described with reference to FIGS. 5 and 6. FIG. 5 is a diagram for explaining a redundant control device. FIG. 6 is a flowchart of the parent-child determination of the control unit of FIG. 5.

The control device may be redundant for failure protection. For example, as shown in FIG. 5, one 5R to be controlled may be controlled by two control units, MCU 1Ra and MCU 1Rb. Thus, for example, even if the MCU 1Ra fails, the 5R can be controlled by the MCU 1Rb. Note that MCU 1Ra and MCU 1Rb have the same configuration as MCU 1R, and MCU 1Ra components are denoted by "a" and MCU 1Rb components are denoted by "b".

The MCU 1Ra and the MCU 1Rb, after judging the parent and the child by software programs that operate independently of each other, set that one is the parent and the other is the child, respectively. For example, as shown in FIG. 6, the MCU 1Ra and the MCU 1Rb confirm that the connection between the MCU 1Ra and the MCU 1Rb is normal (S1).

Next, the MCU 1Ra transmits the random number (RA) generated by the MCU 1Ra to the MCU 1Rb (S2a). The MCU 1Rb transmits the random number (RB) generated by the MCU 1Rb to the MCU 1Ra (S2 b).

Next, if RA>RB, the MCU 1Ra determines the MCU 1Ra that is its own MCU as the parent, if RA>RB, determines the MCU 1Rb that is the other MCU as the child, and if RA<RB, determines the MCU 1Ra as the child, and if RA<RB, determines the MCU 1Rb as the parent (S3a). If RA>RB, the MCU 1Rb determines the MCU 1Ra as the other MCU as the parent, and if RA<RB, determines the MCU 1Rb as the own MCU as the child, and if RA<RB, determines the MCU 1Ra as the child and the MCU 1Rb as the parent (S3b). Therefore, the MCU 1Ra and the MCU 1Rb execute the processes of the different software programs.

Thereafter, the MCU 1Ra and the MCU 1Rb start to control the 5R to be controlled by the operations of the respective software programs. However, since the parent and the child start control of the 5R to be controlled by independent software programs, the timings for setting the values of A, B, and C to the timer counter unit are different, and the timings for starting the counting of the counters are shifted from each other. When the start timings of counting of the counters deviate from each other, the outputs of the control signals deviate from each other. When the parent-child relationship is fixed so that the first MCU 1Ra is the parent and the second MCU 1Rb is the child, the same two software program are executed simultaneously, so that the start timings of counting of the counters do not deviate between the parent and the child, but even when the parent-child relationship is fixed, the start timings of counting of the counters may deviate between the parent and the child when the counters operate with clocks different from each other by the parent and the child.

Figure 7:
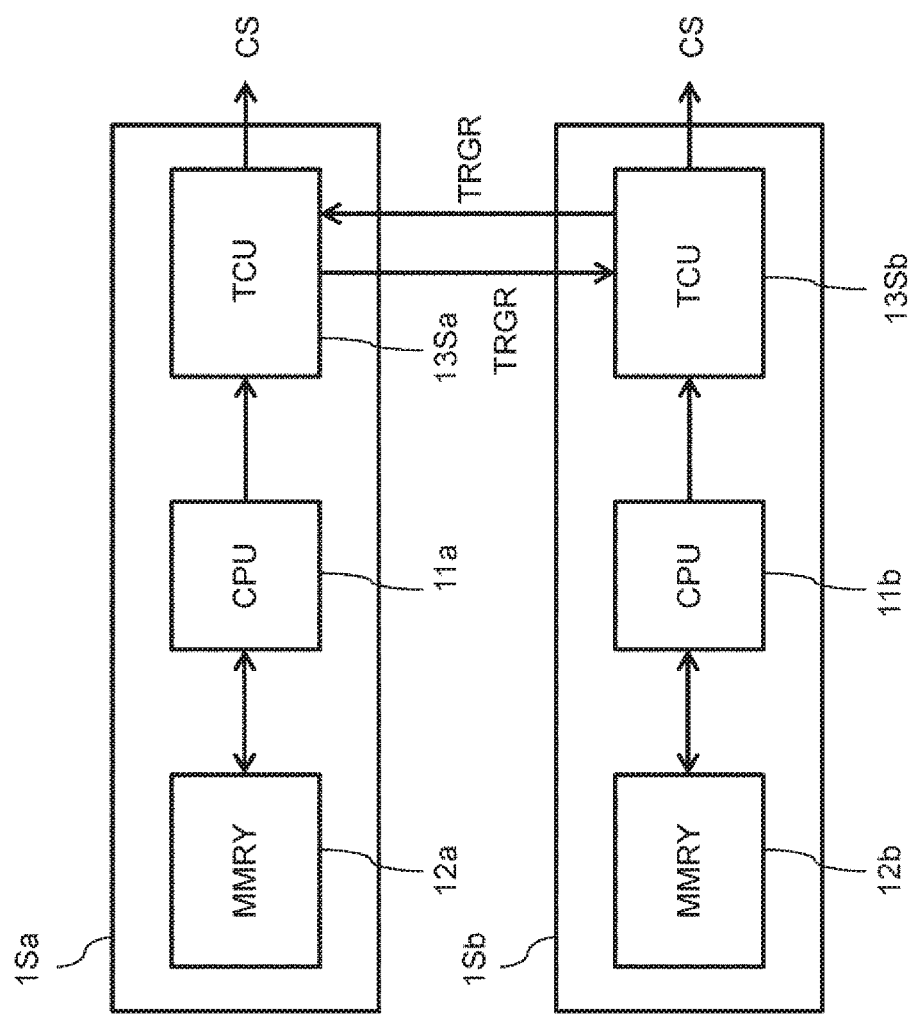
FIG. 7 is a block diagram showing a configuration of the MCUs of a parent and a child of a comparative example.
Figure 8:
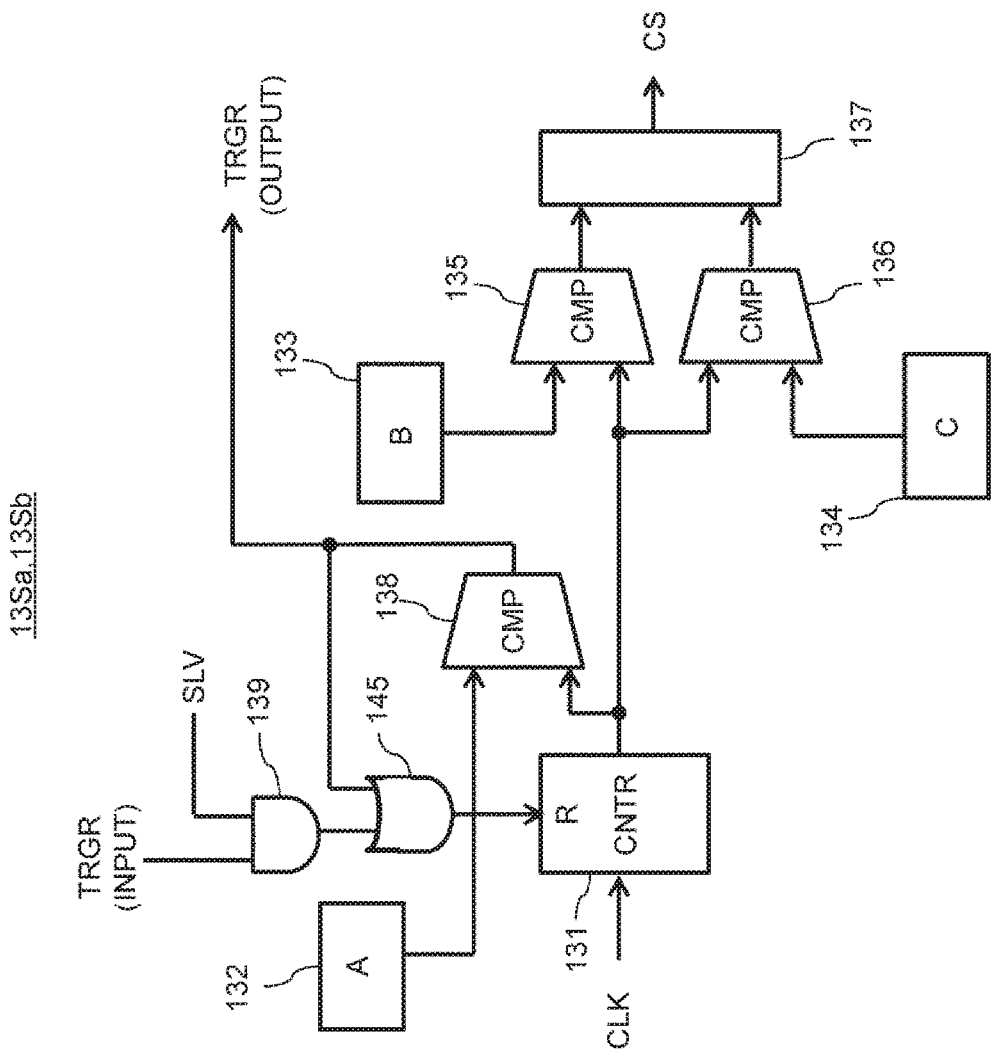
FIG. 8 is a block diagram of a timer counter unit of FIG. 7.
Figure 9:
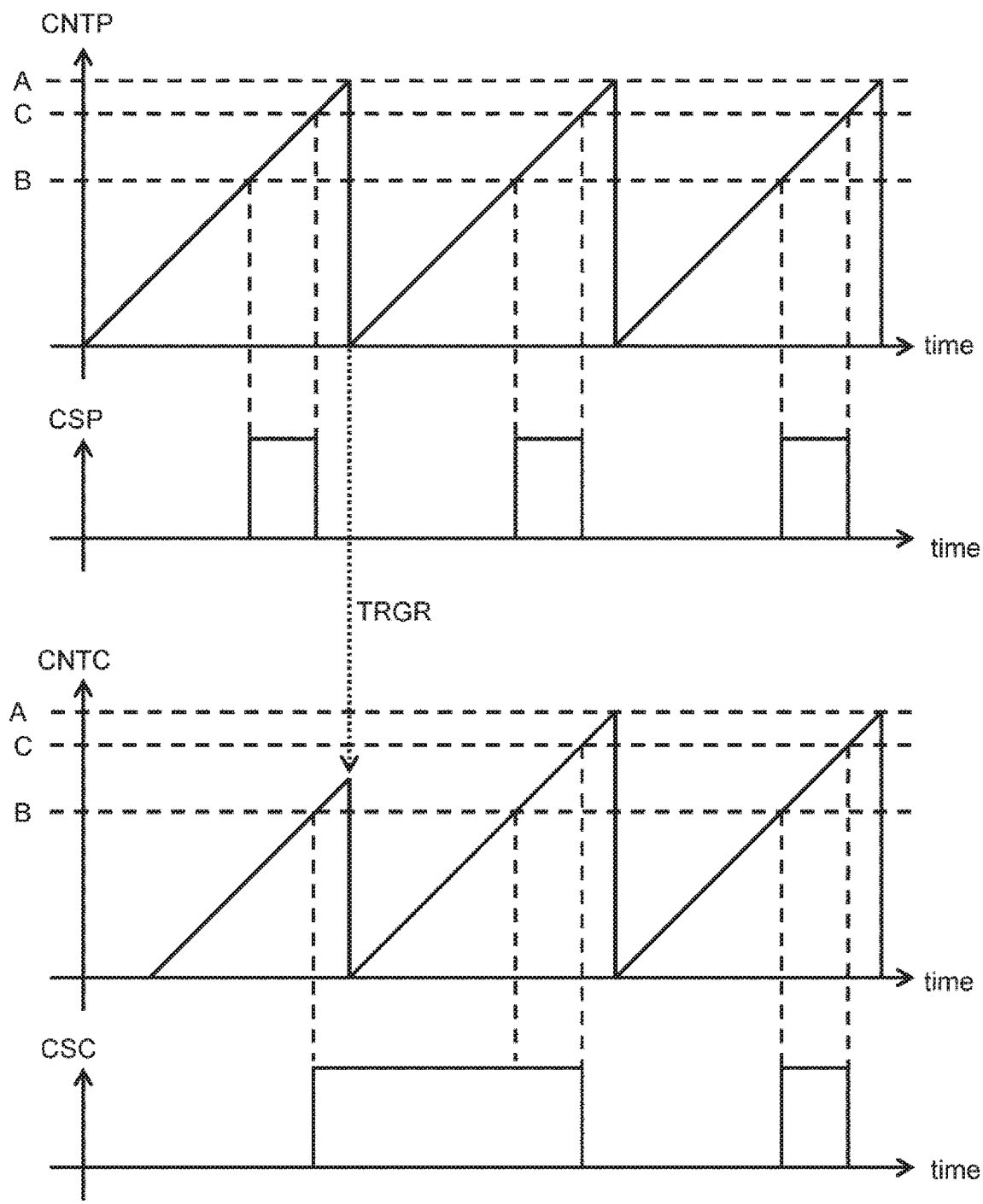
FIG. 9 is a diagram illustrating waveforms of counters and a control signal of the parent and the child of FIG. 7.

Next, the synchronization of the start timings of the counts of the counters incorporated in the two MCUs of the comparative example will be described with reference to FIGS. 7 to 9. FIG. 7 is a block diagram showing a configuration of MCUs of a parent and a child of a comparative example. FIG. 8 is a block diagram of the timer counter unit of FIG. 7. FIG. 9 is a waveform diagram of a parent and a child counters and a control signal.

As shown in FIG. 7, the MCU 1Sa of the comparative embodiment includes a CPU 11a, a memory (MMRY) 12a for storing a software program, and the like, and a timer counter unit (TCU) 13Sa. The MCU 1Sb includes a CPU 11b, a memory (MMRY) 12b for storing a software program, and the like, and a timer counter unit (TCU) 13Sb. The CPU 11a and the CPU 11b, the memory 12a and the memory 12b, and the timer counter unit 13Sa and the timer counter unit 13Sb have the same configuration.

As shown in FIG. 8, each of the timer counter units 13Sa and 13Sb includes a counter (CNTR) 131S that counts up by a given clock signal (CLK), registers 132, 133, and 134, comparators (CMPs) 135, 136, and 138, and an edge-detecting circuit 137. The counter (CNTR) 131 has a function of outputting a trigger signal (TRGR) when the count value becomes A (comparator 138), and a function of resetting the count value to 0 by the inputted trigger signal (TRGR) (AND gate 139 and OR gate 145). However, when the signal (SLV) indicating that the timer counter unit is a child is H, the trigger signal (TRGR) is inputted to the counter 131 by the AND gate 139.

Hereinafter, it is assumed that the MCU 1Sa is determined as a parent and the MCU 1Sb is determined as a child by the parent-child determination in FIG. 6. The MCU 1Sb of the child depends on the MCU 1Sa of the parent.

As shown in FIG. 9, when the count value (CNTP) of the counter 131 of the MCU 1Sa of the parent becomes A, the MCU 1Sa of the parent transmits a trigger signal (TRGR) to the MCU 1Sb of the child. The counter 131 of the MCU 1Sb of the child is reset by the trigger signal (TRGR), the count value (CNTC) of the counter 131 of the child is adjusted to the count value (CNTP) of the counter 131 of the parent, and the count start timing of the counter 131 of the child is synchronized with the count start timing of the counter 131 of the parent.

As illustrated in FIG. 9, in the comparative example, due to the synchronization described above, the count value (CNTC) of the counter 131 of the child is 0 without reaching the maximum value, so that the pulse disappears and the control signal (CSP) of the parent and the control signal (CSC) of the child may differ. That is, since the count value (CNTC) of the child becomes 0 without reaching the count value (C) for changing the control signal (CSC) from H to L, the control signal (CSC) of the child continues to be outputted beyond the normal cycle. Therefore, the control signal (CSP) of the parent and the control signal (CSC) of the child are different from each other.

Figure 10:
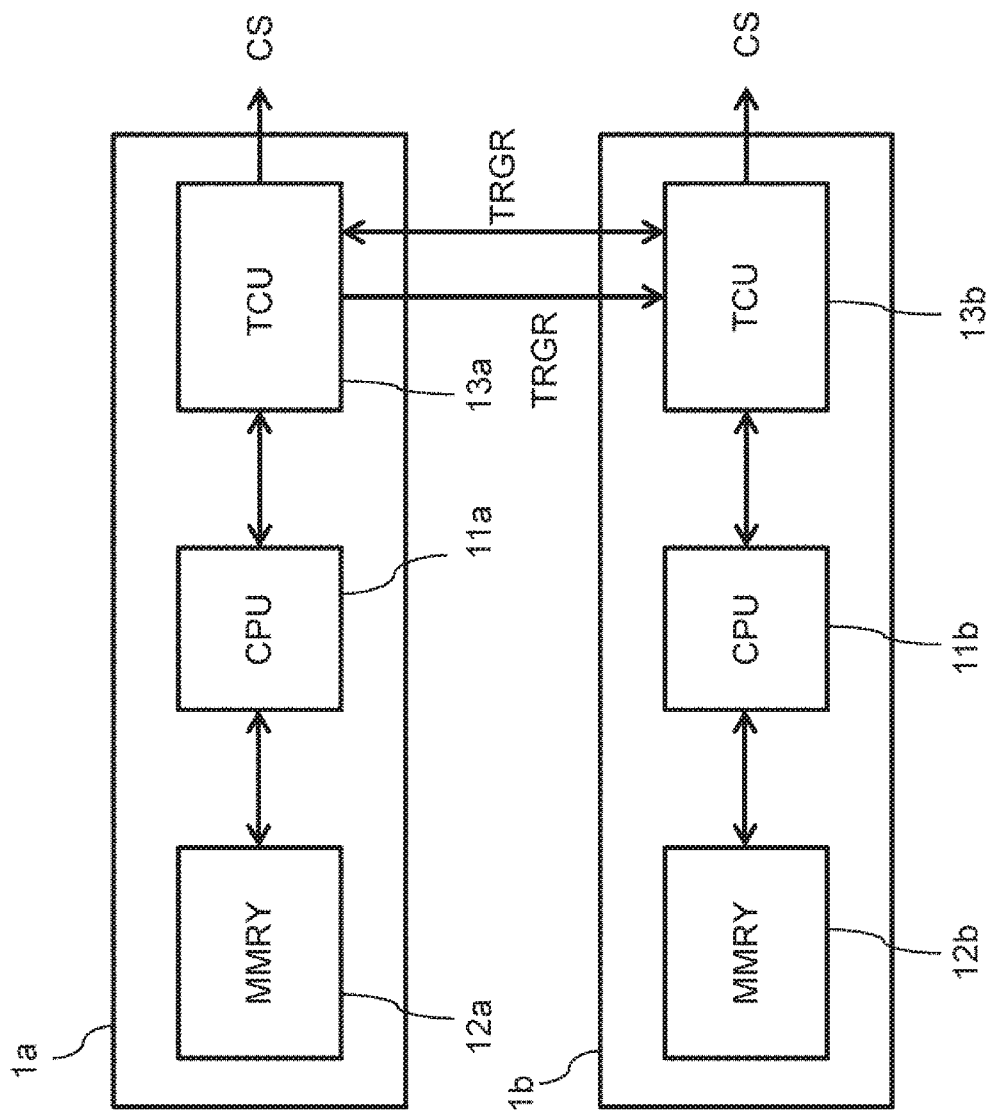
FIG. 10 is a block diagram illustrating a configuration of MCUs of a parent and a child of an embodiment.
Figure 11:
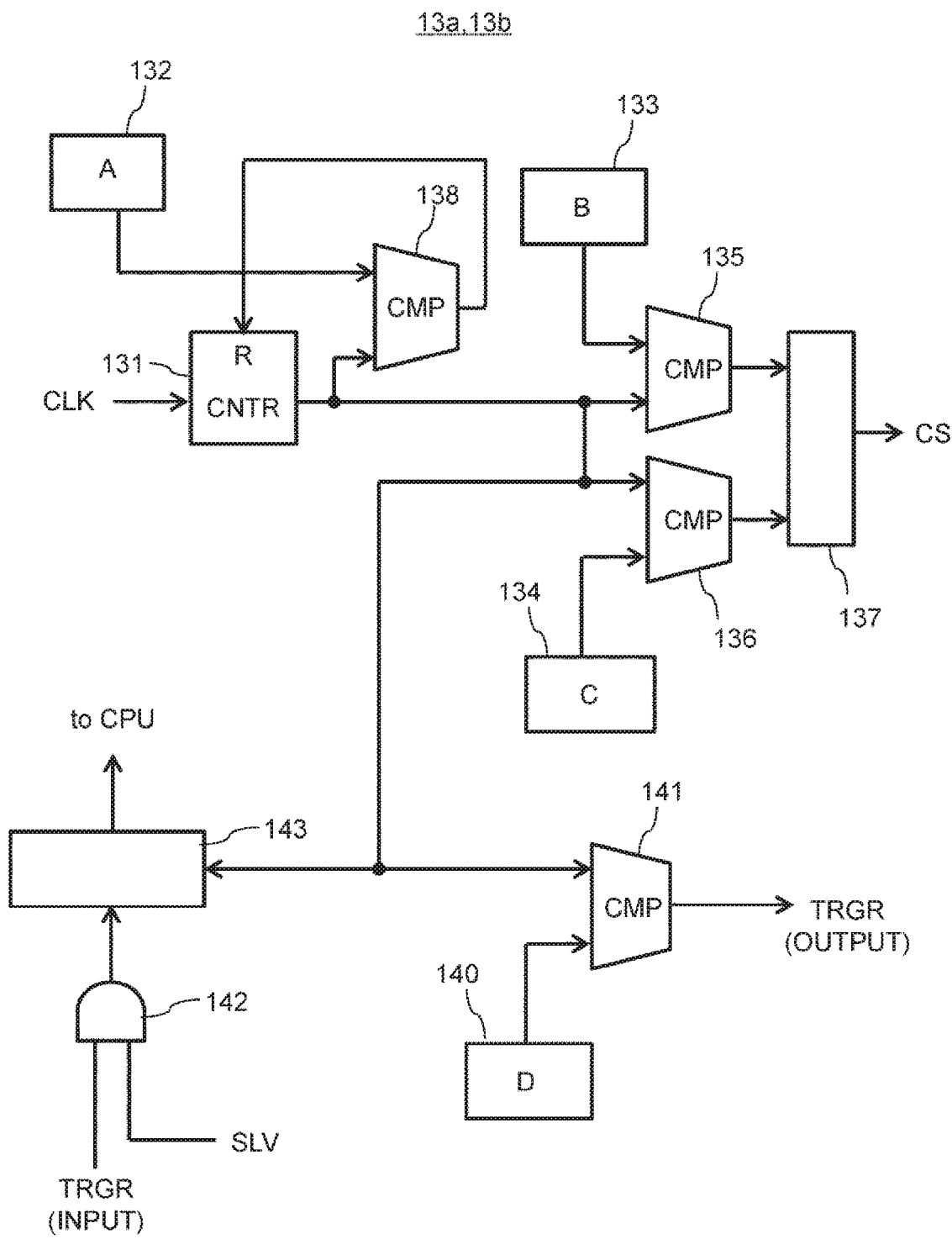
FIG. 11 is a block diagram showing a timer counter unit of FIG. 10.
Figure 12:
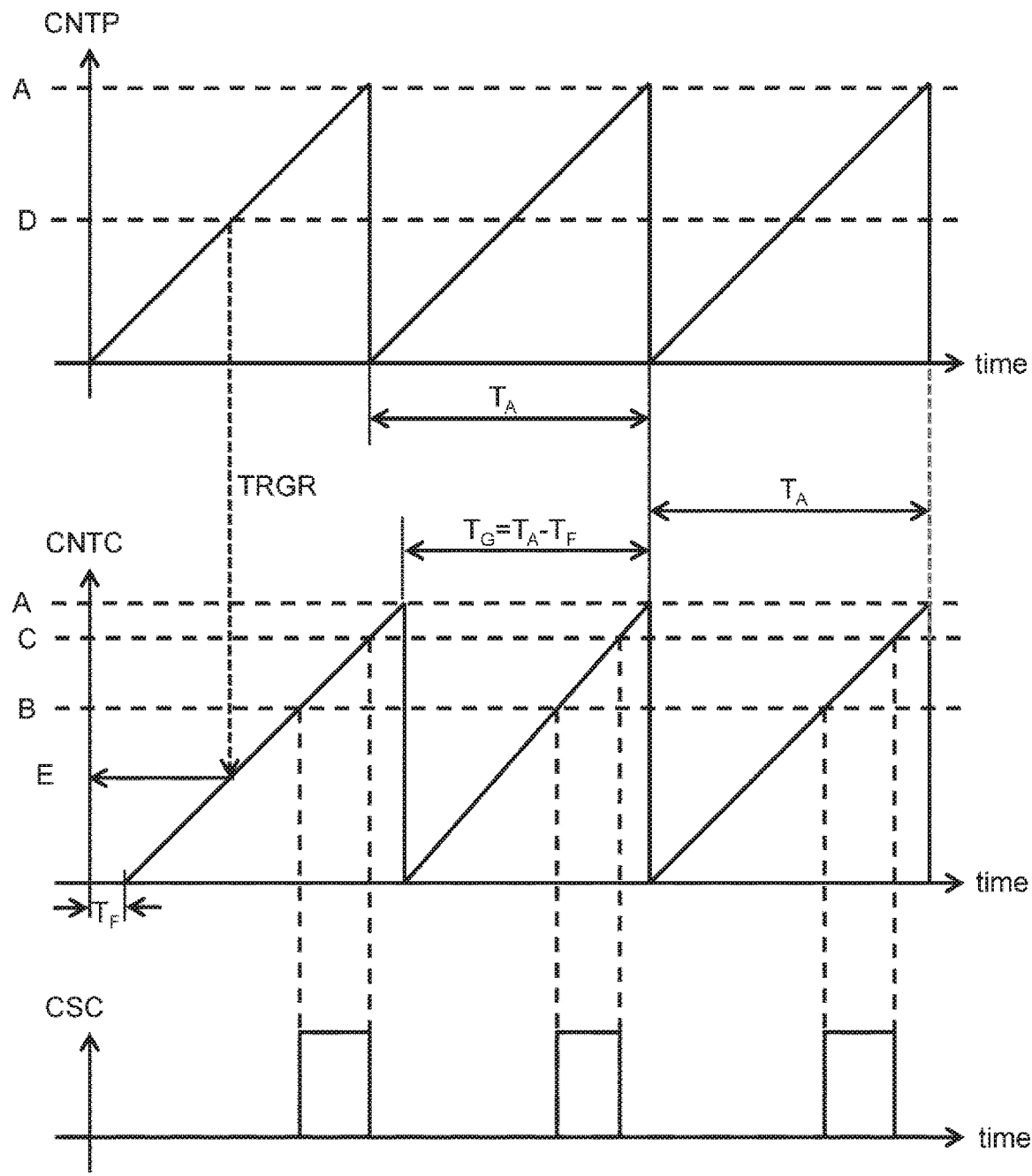
FIG. 12 is a diagram illustrating synchronization by a first method, and illustrating waveforms of counters of a parent and a child and a control signal of the child.
Figure 13:
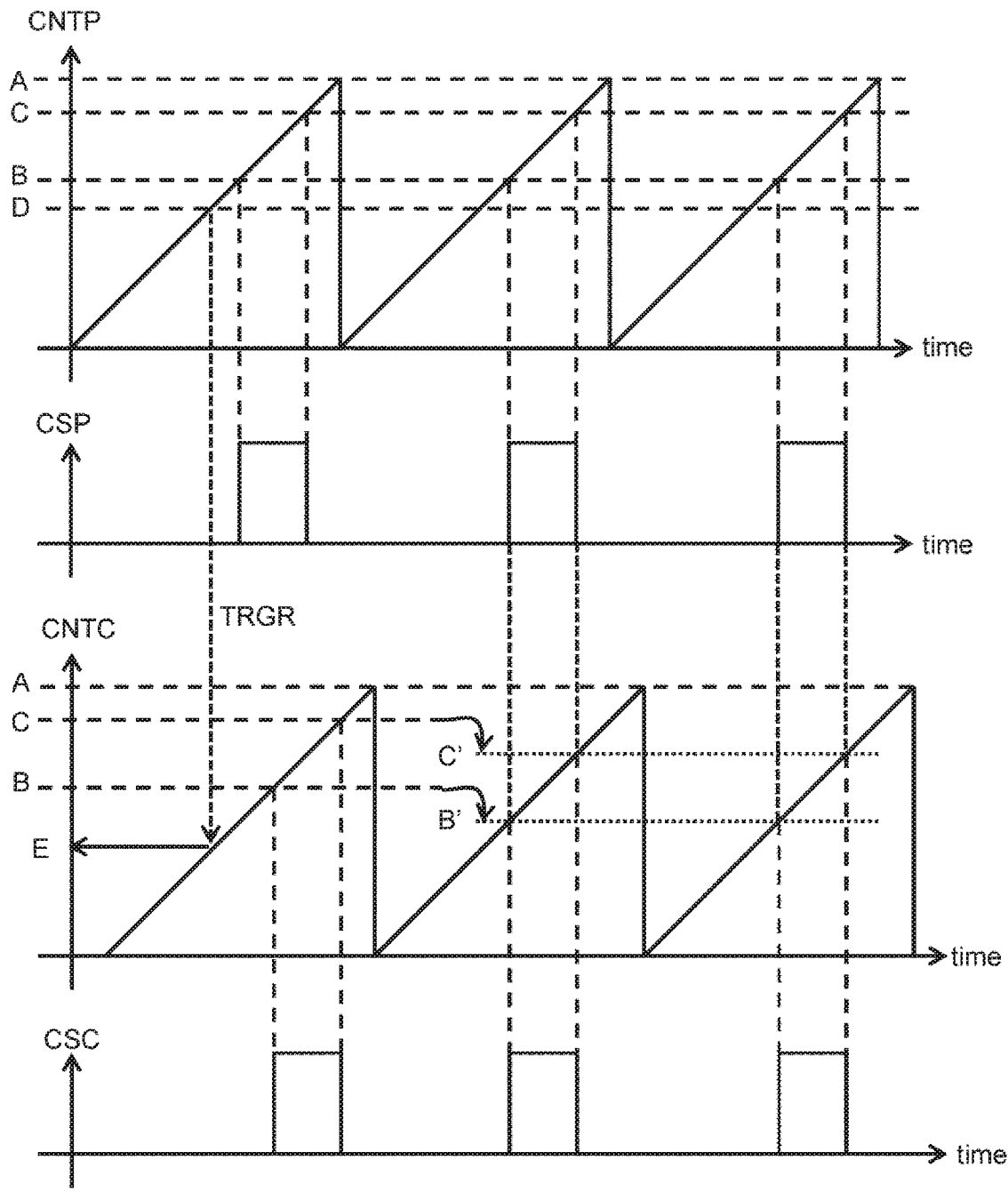
FIG. 13 is a diagram illustrating synchronization by a second method, and illustrating waveforms of counters and control signals of a parent and a child.
Figure 14:
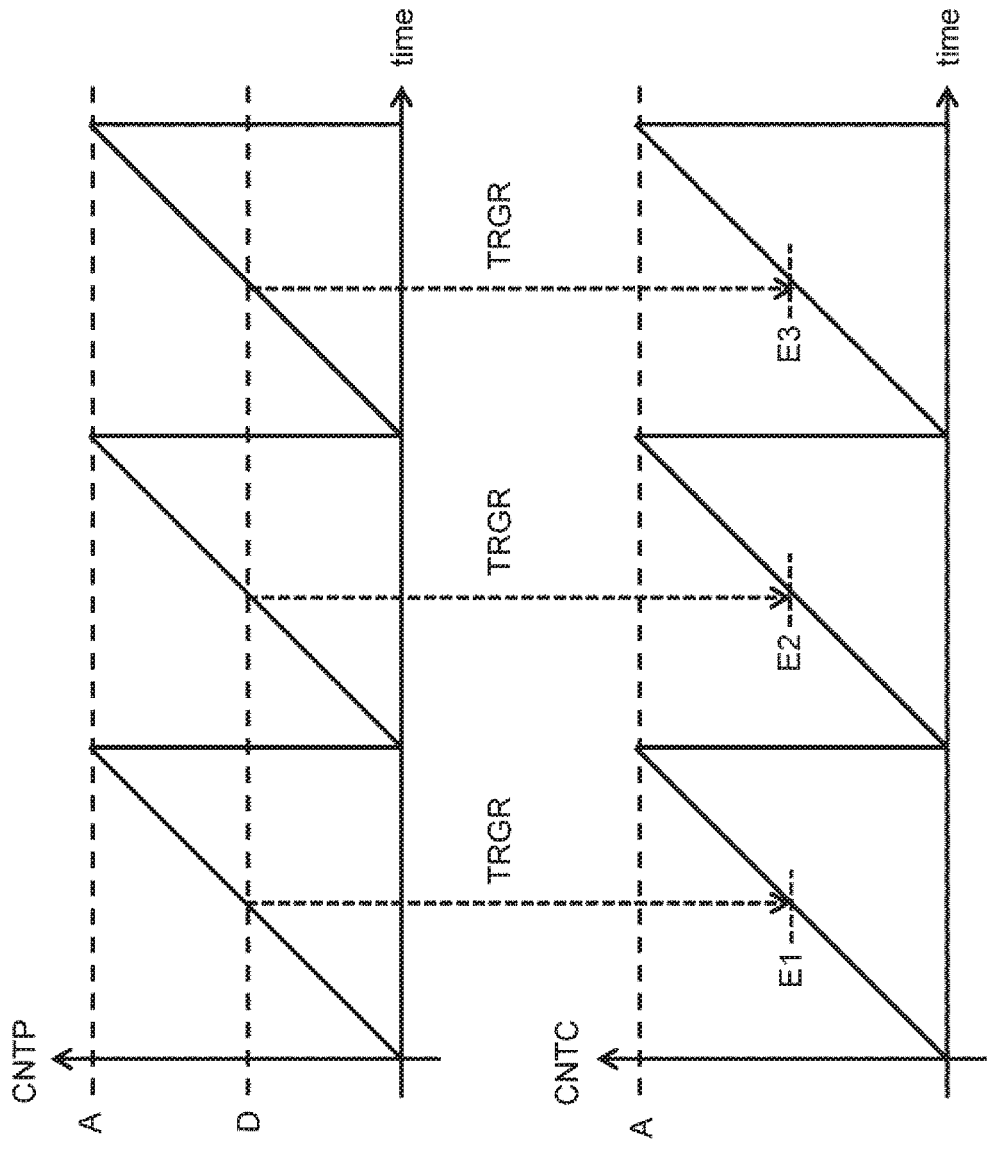
FIG. 14 is a diagram illustrating a case in which synchronization is not performed, and illustrating waveforms of counters of a parent and a child.

Next, the synchronization of the start timings of the counts of the counters built in the two MCUs of the embodiment for solving the problem of the comparative example will be described with reference to FIGS. 10 to 14. FIG. 10 is a block diagram showing a configuration of a parent and a child MCUs according to the embodiment. FIG. 11 is a block diagram showing the timer counter unit of FIG. 10. FIG. 12 is a diagram for explaining synchronization by the first method, and is a waveform diagram of a parent and a child counters and control signals of a child; FIG. 13 is a diagram for explaining synchronization by the second method, and is a waveform diagram of a parent a child counters and a parent and a child control signals. FIG. 14 is a diagram for explaining a case where synchronization is not performed, and is a waveform diagram of counters of a parent and a child.

As shown in FIG. 10, the MCU 1a includes a CPU 11a, a memory (MMRY) 12a for storing a software program, and the like, and a timer counter unit (TCU) 13a. The MCU 1b includes a CPU 11b, a memory (MMRY) 12b for storing a software program, and the like, and a timer counter unit (TCU) 13b. The CPU 11a and the CPU 11b, the memory 12a and the memory 12b, and the timer counter unit 13a and the timer counter unit 13b have respectively the same configuration.

As shown in FIG. 11, each of the timer counter units 13a and 13b includes a counter (CNTR) 131 for counting up by a given clock signal (CLK), registers 132, 133, 134, 140, and 143, comparators (CMPs) 135, 136, 138, and 141, and an edge-detecting circuit 137. The registers 133, 134, and 140 are so-called compare registers, and the register 143 is so-called capture registers. The counter (CNTR) 131 has a function of outputting a trigger signal (TRGR) when the count value becomes the content (e.g. D) of the register 140 (comparator 141), and a function of storing the count value in the register 143 by the inputted trigger signal (TRGR) (AND gate 142). However, when the signal (SLV) indicating that the timer counter unit is a child (operating in the second mode) is H, the trigger signal (TRGR) input from the parent (external device) is input to the register 143 by the AND gate 142. The edge detection circuit 137 raises the control signal (CS) based on the rise of the coincidence signal of the comparator 135, and lowers the control signal (CS) based on the rise of the coincidence signal of the comparator 136. The control signal (CS) is output to the outside of the MCU 1a and 1b through the output circuit. The coincidence signal of the comparator 141 is output as a trigger signal (TRGR) to the outside of the MCU 1a and 1b through the output circuits. When the timer counter unit operates in the second mode, a value which does not coincide with the count value of the counter 131 may be set in the register 140, and a coincidence signal may not be output from the comparator 141, that is, a trigger signal (TRGR) may not be output.

Hereinafter, it is assumed that the MCU 1a is determined as a parent and the MCU 1b is determined as a child by the parent-child determination in FIG. 6. In this case, the timer counter unit 13a of the parent operates in the first mode and the timer counter unit 13b of the child operates in the second mode.

As shown in FIG. 12, when the count value (CNTP) of the counter 131 of the MCU 1a of the parent reaches a predetermined value (D), the MCU 1a of the parent transmits a trigger signal (TRGR) to the MCU 1b of the child. The count value (CNTC) of the MCU 1b of the child counter 131 is stored in the register 143 by the trigger signal (TRGR). The MCU 1b of the child obtains the time difference ($T_F$) between the start timing of the count of the counter 131 of the parent and the start timing of the count of the counter 131 of the child from the difference between D and E of the count value (CNTC) at that time. In the synchronization of the first approach, the count period of the child ($T_G=T_A-T_F$) until the maximum value (A) of the count value (CNTC) is reached is adjusted. ($T_A$: the count period of the parent) The count period of the child is adjusted by the CPU 11b controlling the voltage of the voltage-controlled oscillator (VCO) of the clock generator composed of, for example, a PLL (Phase Locked Loop) based on $T_G=T_A-T_F$. This makes it possible to synchronize the start timing of the counting of the counter 131 of the parent and the counter 131 of the child.

As shown in FIG. 13, in the synchronization of the second method, when the count value (CNTP) of the counter 131 of the MCU 1a of the parent reaches a predetermined value (D), the MCU 1a of the parent transmits a trigger signal (TRGR) to the MCU 1b of the child. The count value (CNTC) of the counter 131 of the MCU 1b of the child is stored in the register 143 by the trigger signal (TRGR). The MCU 1b of the child adjusts the count value (B) for changing the control signal (CSC) from L to H and the count value (C) for changing the control signal (CSC) from H to L by the difference between D and E of the count value (CNTC) at that time. That is, the CPU 11b obtains B'=B−(D−E) and C'=C−(D−E), and sets them in the registers 133 and 134. Thus, the rising and falling of the control signal (CSP) of the parent and the control signal (CSC) of the child can be synchronized.

In the first method of the embodiment, the counted values (CNTP and CNTC) of the counters 131 of the respective MCU 1a and 1b are compared, and the count period is corrected so as to correct the difference between the counted values (CNTP and CNTC). In the first method of the embodiment, the count period is adjusted, and the maximum value of the counter 131 is not changed from that before the correction. In the second method, the count values (CNTP and CNTC) of the counters 131 of the respective MCU 1a,1b are compared, and one of the count values (B) and the count value (C) is corrected so as to correct the difference between the count values (CNTP and CNTC). The second method adjusts the count value (B) and the count value (C), and the maximum value of the counter 131 is not changed as before correction. Therefore, in either method, the count value is not returned to 0 for synchronization before reaching the count value (C) that changes the control signals (CSP and CSC) from H to L.

In the present embodiment, as shown in FIG. 14, it is preferable that synchronization is not performed every fixed cycle, but is performed when the difference between the count values exceeds a predetermined threshold value Th. That is, when |D−E1|≤Thc, |D−E2|≤Thc, and |D−E3|≤Thc, the synchronization operation is not performed. As a result, the number of times of synchronization can be reduced, and the CPU load can be reduced.

(Embodiment)

An electric power steering device mounted on a vehicle will be described as an example of an electric drive device for driving a driven object using an electric motor such as a three-phase motor as a drive source. In this electric power steering device, an electric motor is driven by an electric motor control device so that an output torque corresponding to a steering torque applied to steering by a driver of a vehicle is generated in the electric motor, and the output torque of the electric motor is applied as an assist torque to a steering shaft to assist steering by the driver of the vehicle.

Figure 15:
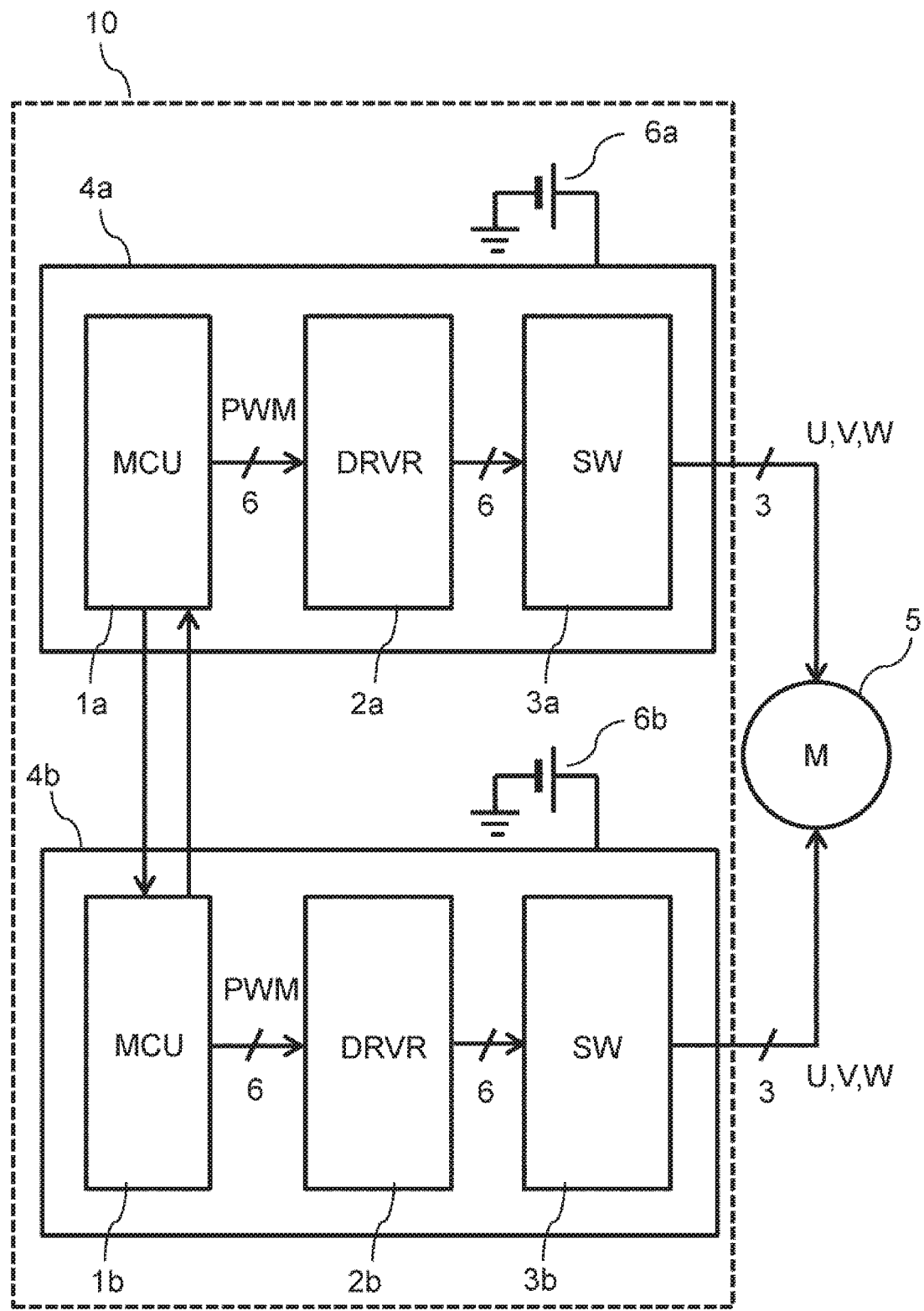
FIG. 15 is a block diagram showing a configuration of a motor and a motor control device of an Embodiment.
Figure 16:
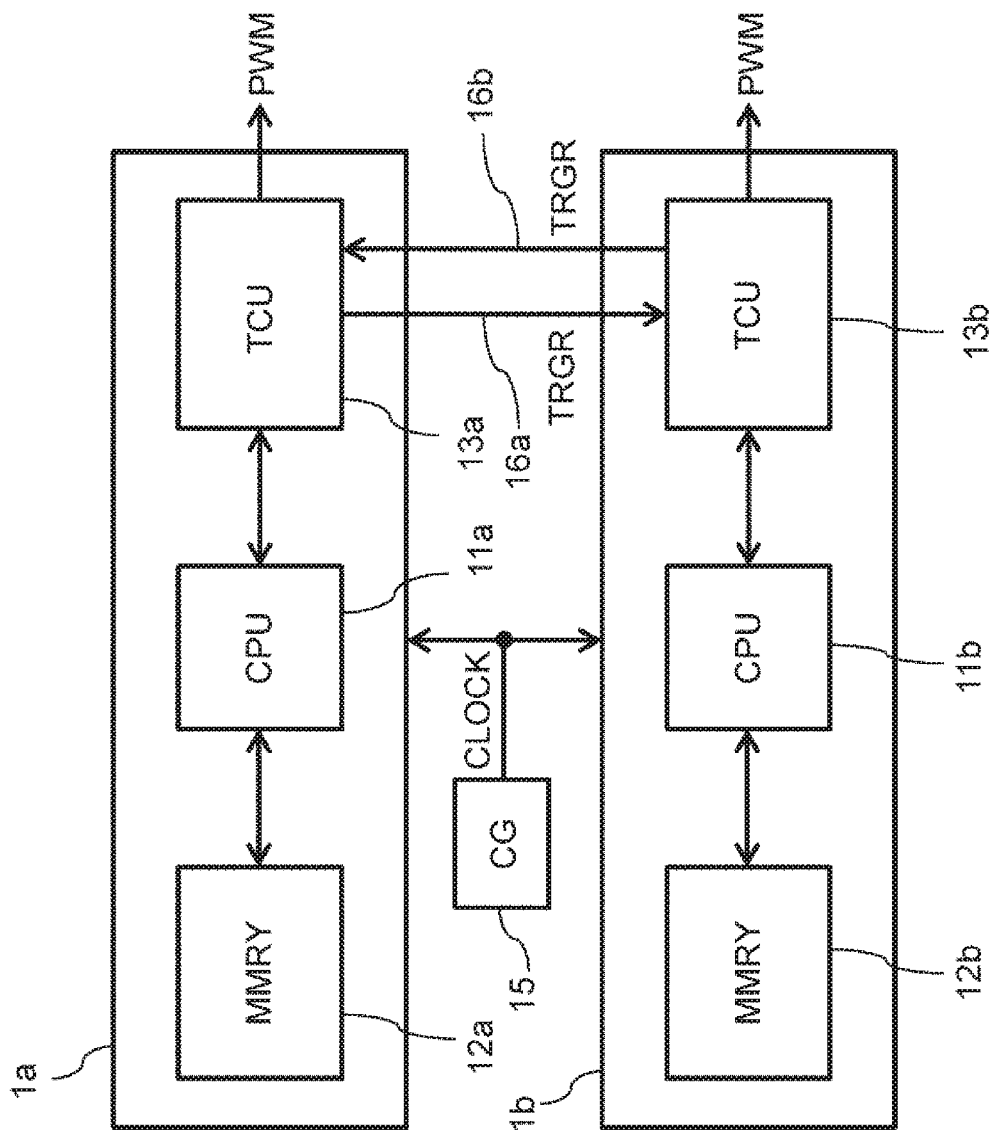
FIG. 16 is a block diagram showing a configuration of MCUs of a parent and a child of FIG. 15.
Figure 17:
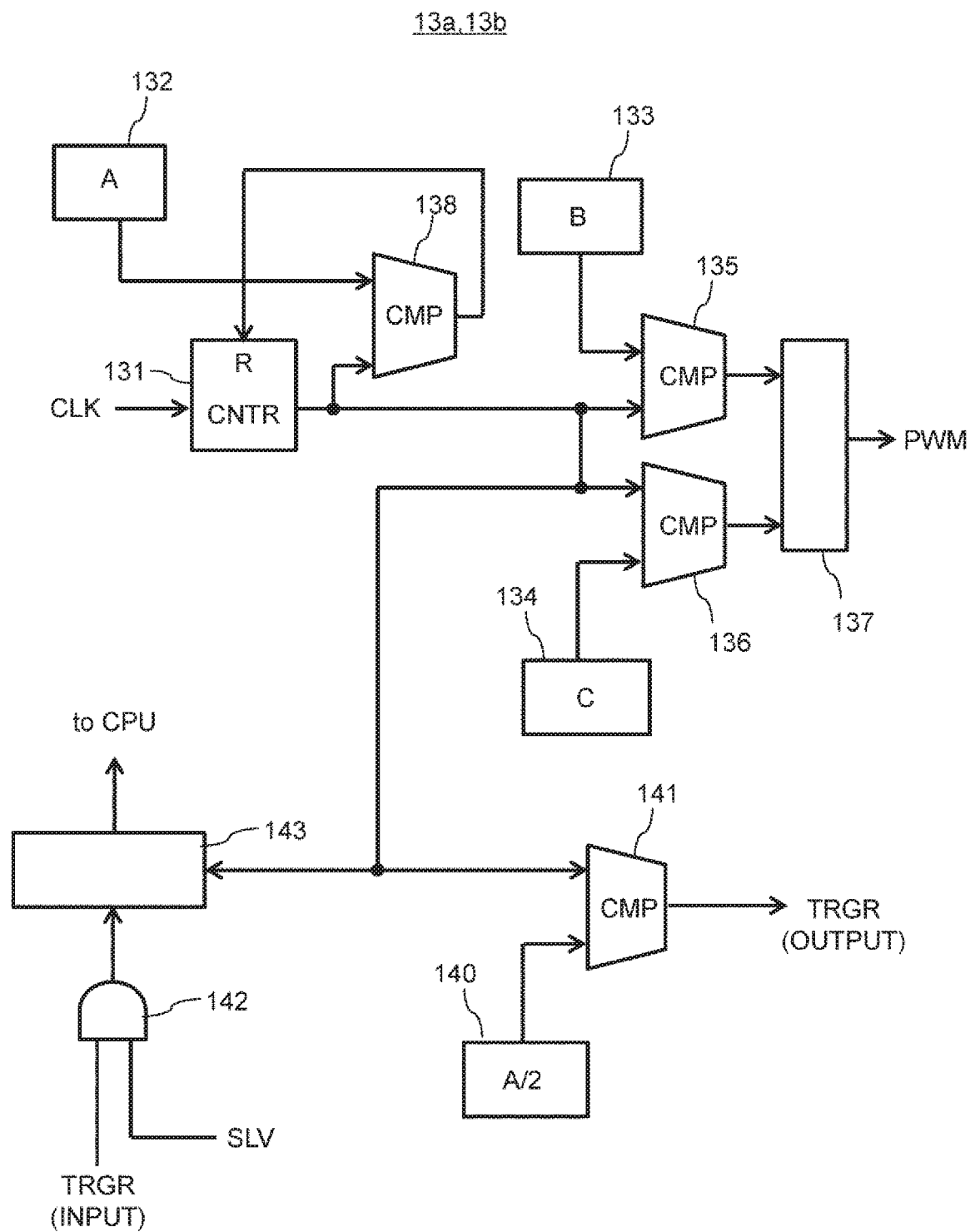
FIG. 17 is a block diagram showing a timer counter unit of FIG. 16.
Figure 18:
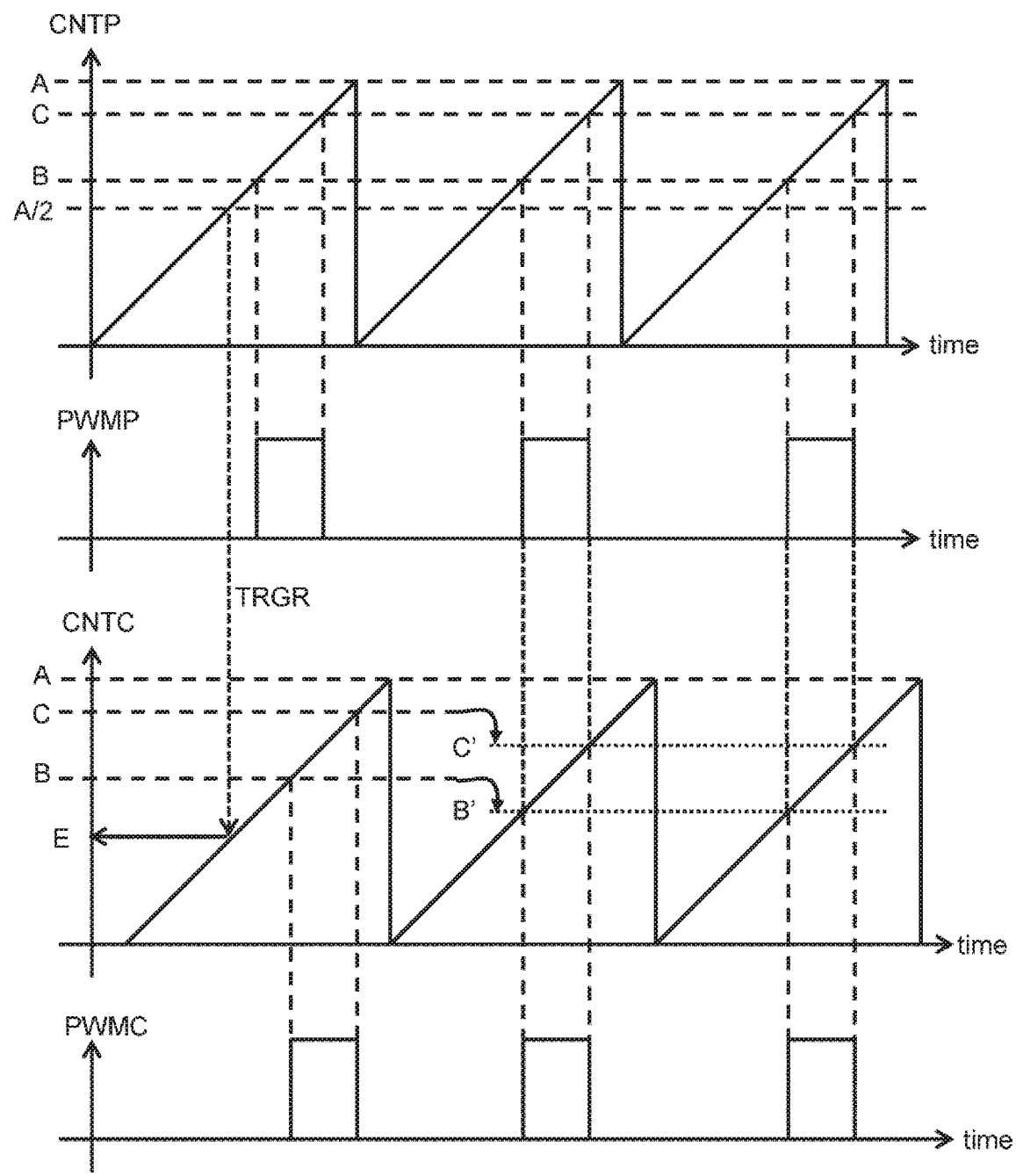
FIG. 18 is a diagram illustrating waveforms of control signals and counters of a parent and a child of FIG. 15.

The motor control device will be described with reference to FIG. 15. FIG. 15 is a block diagram showing a configuration of an electric motor and the electric motor control device of the Embodiment. FIG. 16 is a block diagram showing the configuration of the parent and the child MCUs of FIG. 15. FIG. 17 is a block diagram showing the timer counter unit of FIG. 16. FIG. 18 is a waveform diagram of the counters of the parent and the child, and the control signals of the parent and the child.

As shown in FIG. 15, the electric power steering device includes, for example, the electric motor control device 10 having two sets of stator windings (not shown) in one electric motor 5 and having two sets of power converter (inverters) 4a and 4b capable of independently controlling the two sets of stator windings. The power converter 4a and 4b convert DC power supplied from the DC power supply 6a and 6b into AC power, and control the electric motor 5. The power converter 4a and 4b each have an MCU 1a and an MCU 1b with a CPU. These MCU 1a and MCU 1b are configured to control the power converter 4a and 4b so that the two sets of power converter 4a and 4b operate in cooperation with each other, and to continue driving the electric motor 5 only with the other power converter operating normally when an abnormality occurs in one of the power converter, and to provide a redundant control system of a double system in preparation for a failure.

The power converter 4a and 4b are composed of a switching element group (SW) 3a and 3b, a driving circuit (DRVR) 2a and 2b for driving the switching element group 3a and 3b, an MCU 1a and 1b for PWM-controlling the driving circuit 2a, 2b, and the like. The switching element group 3a and 3b includes six switching elements, i.e., a U-phase switching element, a V-phase switching element, a W-phase switching element for an upper arm, a U-phase switching element, a V-phase switching element, and a W-phase switching element for a lower arm, which are not shown, and the respective switching elements are composed of, for example, a power semiconductor device such as a IGBT or a power MOSFET. The driving circuits 2a, 2b are each composed of six driving semiconductor devices corresponding to, for example, six power semiconductor devices. Each of MCU 1a and MCU 1b is a control semiconductor device for outputting six PWM signals corresponding to, for example, six driver circuits semiconductor device.

As shown in FIG. 16, the MCU 1a includes a CPU 11a, a memory (MMRY) 12a for storing a software program, and the like, and a timer counter unit (TCU) 13a in one semiconductor chip. The MCU 1b includes a CPU 11b, a memory (MMRY) 12b for storing a software program, and the like, and a timer counter unit (TCU) 13b in one semiconductor chip. The memories 12a and 12b include a nonvolatile storage device such as a flash memory and a volatile storage device such as a SRAM. The CPU 11a and the CPU 11b, the memory 12a and the memory 12b, and the timer counter unit 13a and the timer counter unit 13b have the same configuration in each pair. The MCU 1a and the MCU 1b are connected by synchronous trigger lines 16a and 16b. The MCU 1a and the MCU 1b operate on the same clock signals (CLOCK) generated by one clock generator (CG) 15.

About the MCU 1a and MCU 1b for respectively controlling the operation of the power converter 4a and 4b, after the parent and the child are determined by the software programs operating independently in the same manner as the software program shown in FIG. 6, one of the MCUs is set as a parent and the other of the MCUs is set as a child. It is assumed that the power converter 4a including the MCU 1a is set as a parent and the power converter 4b including the MCU 1b is set as a child. Thereafter, the motor control is started by the operation of the respective software programs. However, since the MCU 1a of the parental power converter 4a and the MCU 1b of the child power converter 4a start the motor control by independent software programs, the start timings of the counting of the counters 131 for generating the PWM control signals are shifted from each other.

As shown in FIG. 17, the timer counter units 13a and 13b of the Embodiment have the same configuration as the timer counter units 13a and 13b of the embodiment (FIG. 11). The clock signal (CLK) supplied to the counter 131 is obtained by dividing the clock signal (CLOCK) generated by the clock generator 15. Although not shown in FIG. 17, the Embodiment timer counter units 13a and 13b include six sets of registers 132, 133 and 134, comparators (CMPs) 135 and 136, and edge-detecting circuits 137, and generate a U-phase PWM signal, a V-phase PWM signal, and a W-phase PWM signal for the upper arm, a U-phase PWM signal, a V-phase PWM signal, and a W-phase PWM signal for the lower arm.

In Embodiment, in order to solve the deviation at the time of starting the motor control, when the count value (CNTP) of the counter 131 of the parent reaches a predetermined value (for example, A/2), the MCU 1a of the parent transmits a trigger signal (TRGR) to the MCU 1b of the child. The MCU 1b of the child adjusts the count value (B) of the PWM signal (PWMC) from L to H and the count value (C) of the PWM signal (PWMC) from H to L by the difference between the count value (E) and the count value (A/2) of the parent at that time.

Hereinafter, a detailed description will be given with reference to FIG. 18. (a) When the count value (CNTP) of the counter 131 of the parent reaches A/2, the timer counter unit 13a of the parent transmits a trigger signal (TRGR) to the timer counter unit 13b of the child. (b) In the CPU1b of the MCU 1b of the child, the difference (A/2−E) between the count values (E) of the counter 131 of the child and the count values (A/2) of the counter 131 of the parent at the timing when the trigger signal (TRGR) is received is used to calculate the difference (MCU 1b) between the count values corresponding to the deviation of the start timing of the counter 131 of the parent and the counter 131 of the child. (c) If (A/2−E)>Thc, the CPU1b of the child numerical values a count value (B') that changes the following PWM signal (PWMC) from L to H and a count value (C') that changes the PWM signal (PWMC) from H to L by considering the result of (b). The results of the adjustments are B'=B−(A/2−E) and C'=C−(A/2−E). The CPU1b sets B' and C' in registers 133 and 134. (d) Based on the above (c) adjustments, the timing of the child PWM signal (PWMC) coincides with the timing of the parental PWM signal (PWMP).

The count period (PWM cycle) of the counter 131 is, for example, about 100 µs, and the frequency of the operation clock signal of the CPU is, for example, about 80 MHz (12.5 ns).

In this Embodiment, the counter 131 counts up to the maximum value (A) as before the correction. Therefore, as in the comparative example, the pulse of the PWM signal, which is the control signal, is not unintentionally continued to the next pulse or is unintentionally lost.

Even if the software programs executed by the two CPUs are different from each other, it is possible to correct the deviation of the start timing between the counter of the timer counter unit of one MCU and the counter of the timer counter unit of the other MCU.

The synchronization timing of the two MCUs is not performed in a fixed cycle, but is performed only when the difference between the counted values of the two MCUs exceeds a threshold value, so that the load on the CPU can be reduced.

As described above, it is possible to reduce the interference due to the switching noise on the PWM signal generated by the timer counter units of the plurality of MCUs.

Since the control timings of the two power converter can be synchronized, the torque ripple of the output torque of the motor can be reduced. The electric power steering device reacts sensitively to the torque ripple of the output torque of the electric motor, but since the torque ripple can be reduced, the output torque of the electric motor becomes smooth without pulsation, and the driving comfort can be secured.

Since the electric motor control device can be made redundant, it is possible to secure the safety of the vehicle by taking adequate countermeasures against the failure of the electric power steering device mounted on the vehicle.

Modified Examples

Hereinafter, some typical modified examples of Embodiment will be exemplified. In a following modified example descriptions, the same reference numerals as in the above-mentioned Embodiment may be used for components having the same structures and functions as those described in the above-mentioned Embodiment. In the description of such portions, the description in the above-mentioned Embodiment can be appropriately incorporated within a scope not inconsistent in the art. In addition, a part of the above-mentioned Embodiment and all or a part of a plurality of modified example may be applied in combination as appropriate within the scope not inconsistent in the art.

First Modified Example

Figure 19:
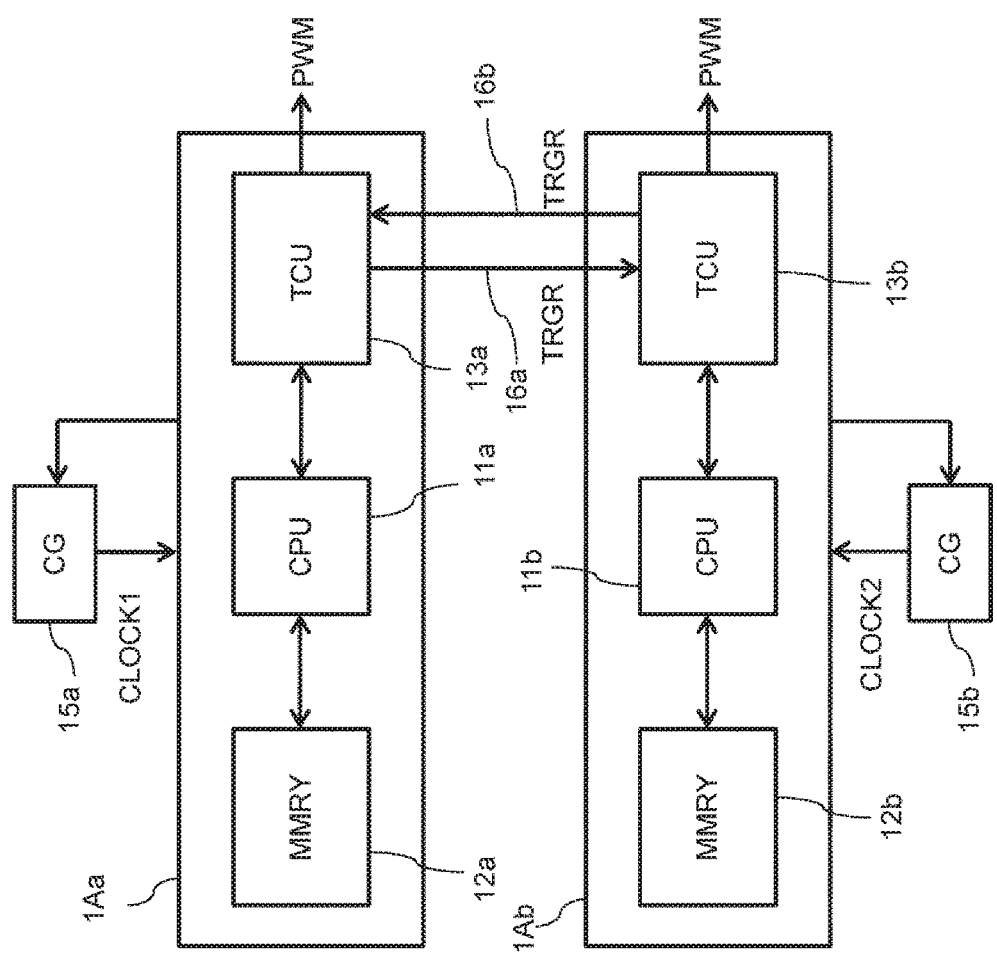
FIG. 19 is a block diagram showing a composition of MCUs of a parent and a child of a first modification example.
Figure 20:
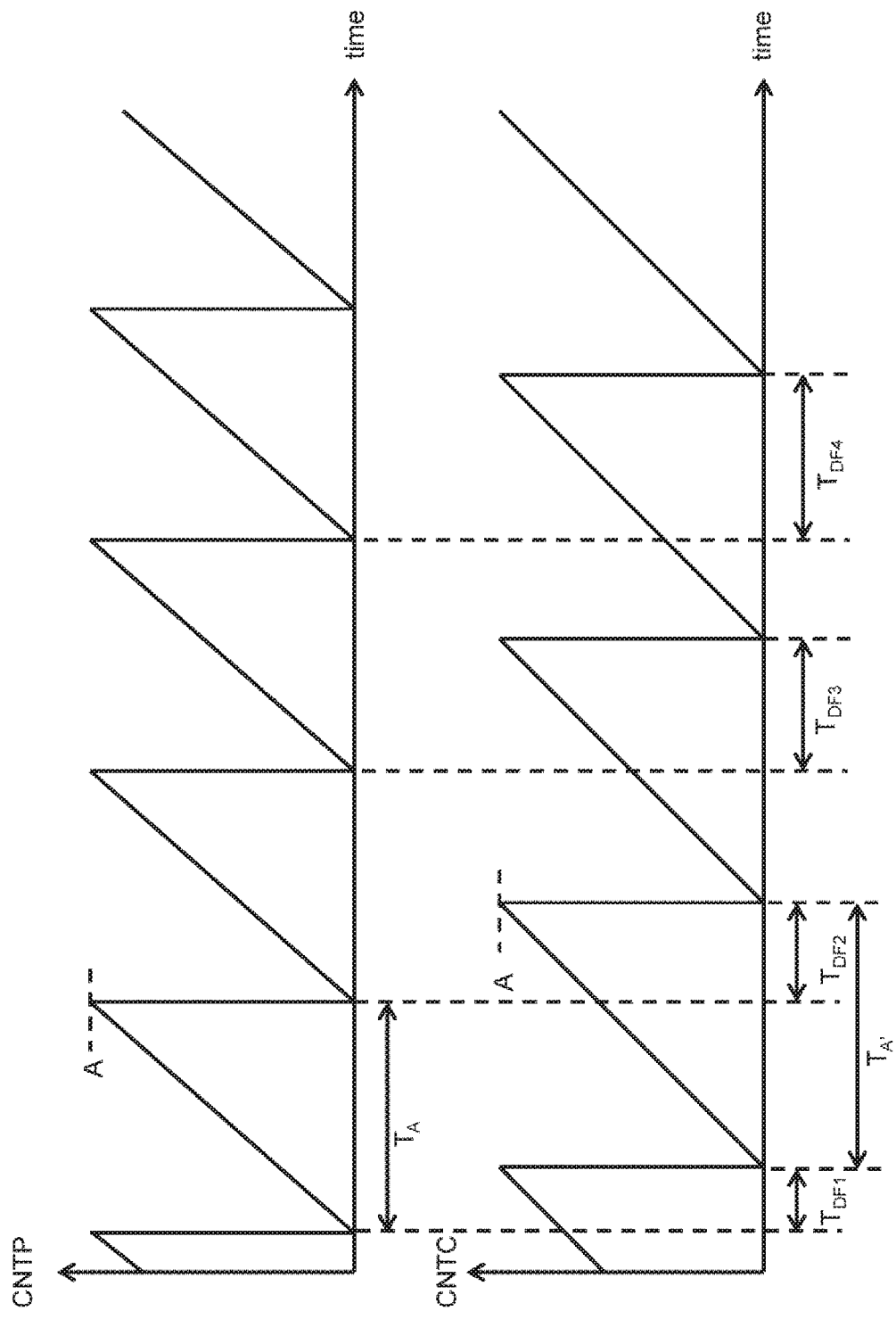
FIG. 20 is a diagram illustrating waveforms of counters of a parent and a child that does not perform synchronization.
Figure 21:
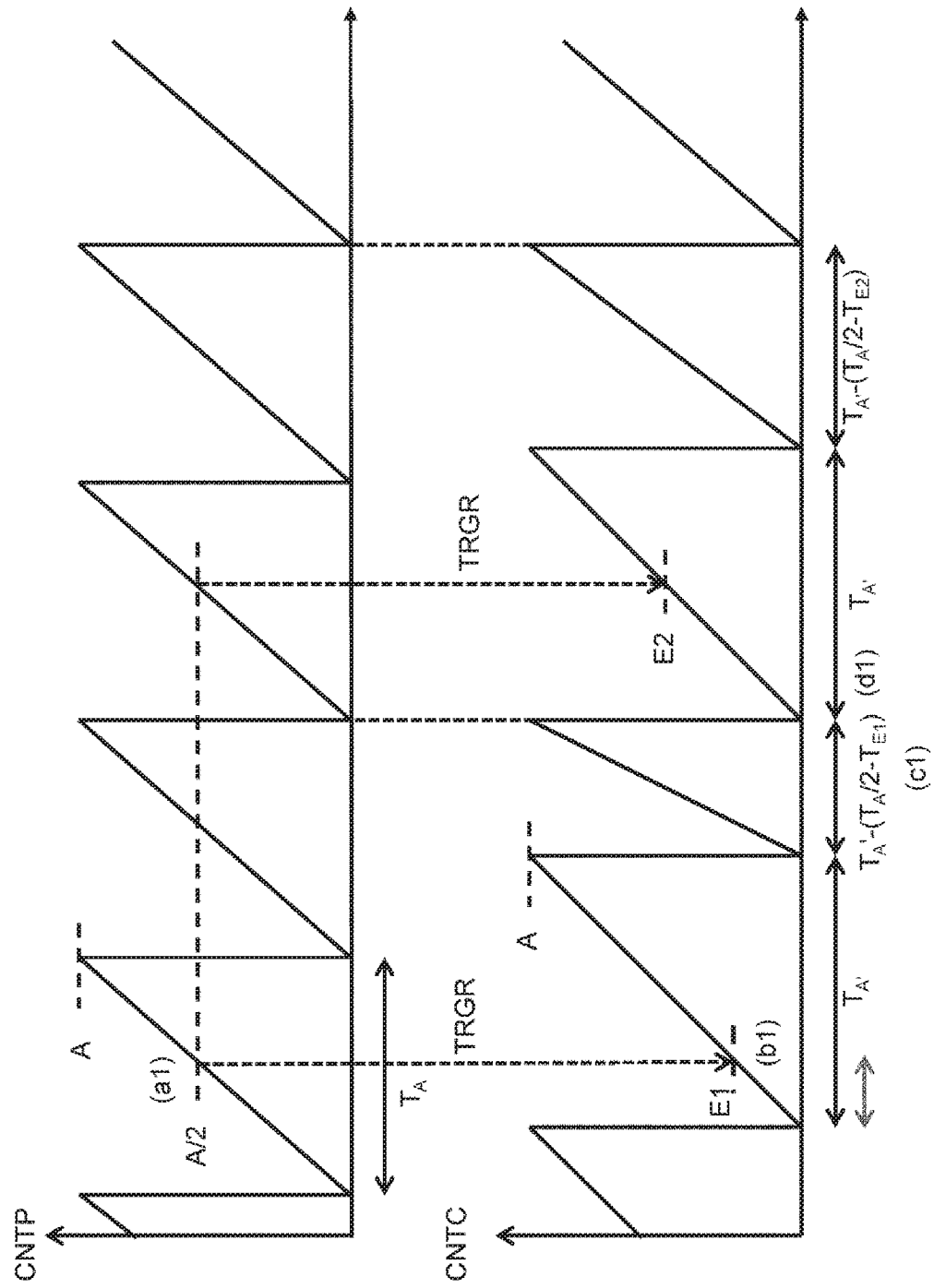
FIG. 21 is a diagram illustrating waveforms of counters synchronizing of a parent and a child.

MCUs of the first modified example will be described with reference to FIGS. 19 to 21. FIG. 19 is a block diagram showing a configuration of the MCUs of a parent and a child of the first modified example. FIG. 20 is a waveform diagram of counters of the parent and the child when synchronization is not performed. FIG. 21 is a waveform diagram of the counters of the parent and the child when synchronizing.

In Embodiment, the MCU 1a and the MCU 1b operate on the same clock (CLOCK) of the clock generator 15. On the other hand, in the first modified example, as shown in FIG. 19, the MCU 1Aa operates with a clock signal (CLOCK1) of a clock generator 15a, and the MCU 1Ab operates with a clock signal (CLOCK2) of a clock generator 15b.

Similar to Embodiment, when the counter 131 of the parent reaches a predetermined value (A/2), the MCU 1Aa of the parent transmits trigger signals (TRGR) to the MCU 1Ab of the child, and the MCU 1b of the child adjusts the count period (PWM-period) from the start of the count of the counter 131 of the child to the maximum value (A) of the count value (CNTC), when the difference (A/2−E) of the count values at that time exceeds a threshold value (Thc). On the other hand, if the A/2−E is less than or equal to the threshold Thc, the MCU 1Ab of child does nothing. After that, the MCU 1Aa of the parent transmits the trigger signal (TRGR) when the counter 131 reaches the predetermined value (A/2). That is, the trigger signal TRGR is periodically transmitted.

In the configuration of the first modified example, the clock generator (CG) 15a of the MCU 1Aa of the parent and clock generator (CG) 15b of the MCU 1Ab of the child differ. Therefore, even if the CPU 11a sets the count value (A) in the register 132 of the timer counter unit 13a and the CPU 11b sets the same count value (A) in the register 132 of the timer counter unit 13b, the time ($T_A$) until the count value (CNTP) of the counter 131 of the parent reaches A differs from the time ($T_{A'}$) until the count value (CNTC) of the counter 131 of the child reaches A. Therefore, even if the start timing of the count of the counter 131 of the parent and the start timing of the count of the counter 131 of the child are the same, the time ($T_A$) until the count value (CNTP) of the counter 131 of the parent reaches A and the time ($T_{A'}$) until the count value (CNTC) of the counter 131 of the child reaches A may be deviated, and the start timings of the counts of the counters 131 may be deviated.

As described above, if (A/2−E) is equal to or less than the threshold value (Thc), the MCU 1Ab of the child does nothing, and therefore, as shown in FIG. 20, the deviation of the start timings of the counts of the counters 131 is accumulated ($T_{DF1}<T_{DF2}<T_{DF3}<T_{DF4}$). On the other hand, when (A/2−E) exceeds the threshold value (Thc), the MCU 1Ab of the child adjusts the count period until the maximum value (A) of the count value is reached.

Hereinafter, a detailed description will be given with reference to FIG. 21. (a1) When the count value (CNTP) of the counter 131 of the parent reaches A/2, the timer counter unit 13a of the parent transmits a trigger signal (TRGR) to the timer counter 13b of the child. Here, the counting period of the counter 131 of the parent (the time until the count value reaches 0 to A) is set to $T_A$. (b1) In the CPU1b of the MCU 1Ab of the child, the deviation $(T_A/2-T_{E1})$ of the parent and the child start timings is calculated using the timing when the trigger signal (TRGR) is received, that is, the timing value of the child $(T_{E1})$ and the timing value of the parent $(T_A/2)$ in E1 of the count value (CNTC) of the counter 131 of the child. Let $T_{A'}$ be the counting period of the counter 131 of the child, i.e., the period until the count value becomes 0 to A. (c1) If $(T_A/2-T_{E1})$>Th, the CPU1b of the child determines the following counting periods by considering the result of (b). The adjusted result is $T_{A'}-(T_A/2-T_{E1})$. The count period (count cycle) is adjusted so that the count value (CNTC) of the counter 131 of the child reaches the largest value A within this period. (d1) Based on the adjustments of (c1), the count value (CNTC) of the counter 131 of the child matches the count value (CNTP) of the counter 131 of the parent. (e1) Repeat (a1) to (d1) above. The count period is adjusted by changing the control voltage of the VCO of the PLL constituting the clock generators 15a and 15b, for example. Since the VCO has a characteristic that the output frequency increases as the control voltage increases, when the count period is shortened, the CPU 11a and 11b control the clock generators 15a and 15b to increase the control voltage of the VCO. For example, the relationships between the control voltages of the VCOs and the output frequencies are measured in advance, tabulated, and stored in the nonvolatile storage device of the memories 12a and 12b. CPU 11a and 11b refer to this table to obtain the desired control voltages.

In the first modified example, the difference between the counted values of the counters of the parent and the child is detected, and the synchronization trigger is outputted only when the difference between the counted values exceeds a predetermined threshold value, and the synchronization is performed. Therefore, since the two control units operate with the clock signals of the clock generators different from each other, it is not necessary to always synchronize even if there is a possibility that the synchronization is deviated. As a result, the number of times of synchronization can be reduced, and the CPU load for synchronization can be reduced. The synchronization can be achieved even if the clock signals of the two clock generators of the MCUs are different.

In Embodiment, if only one clock generator fails, the control of the electric motor 5 cannot be continued. However, in the first modified example, since each MCU has a clock generator, even if one clock generator fails, the control of the electric motor 5 can be continued by the MCU having the other clock generator. This makes it is possible to increase redundancy and safety.

Second Modified Example

The mutual monitoring of the power converters, which are two control devices, will be described with reference to FIGS. 22 to 28.

Figure 22:
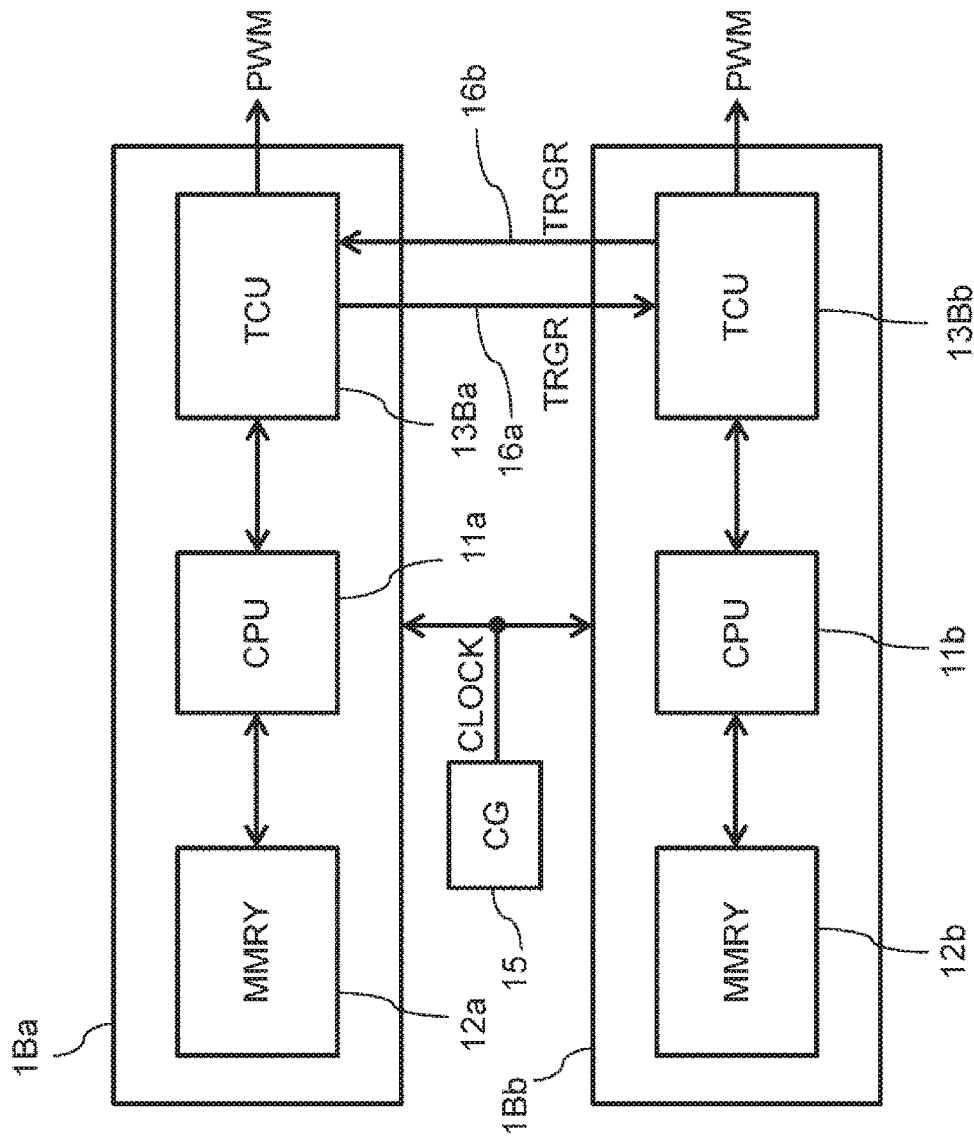
FIG. 22 is a diagram showing a configuration of two MCUs of a second modified example of FIG. 6.
Figure 23:
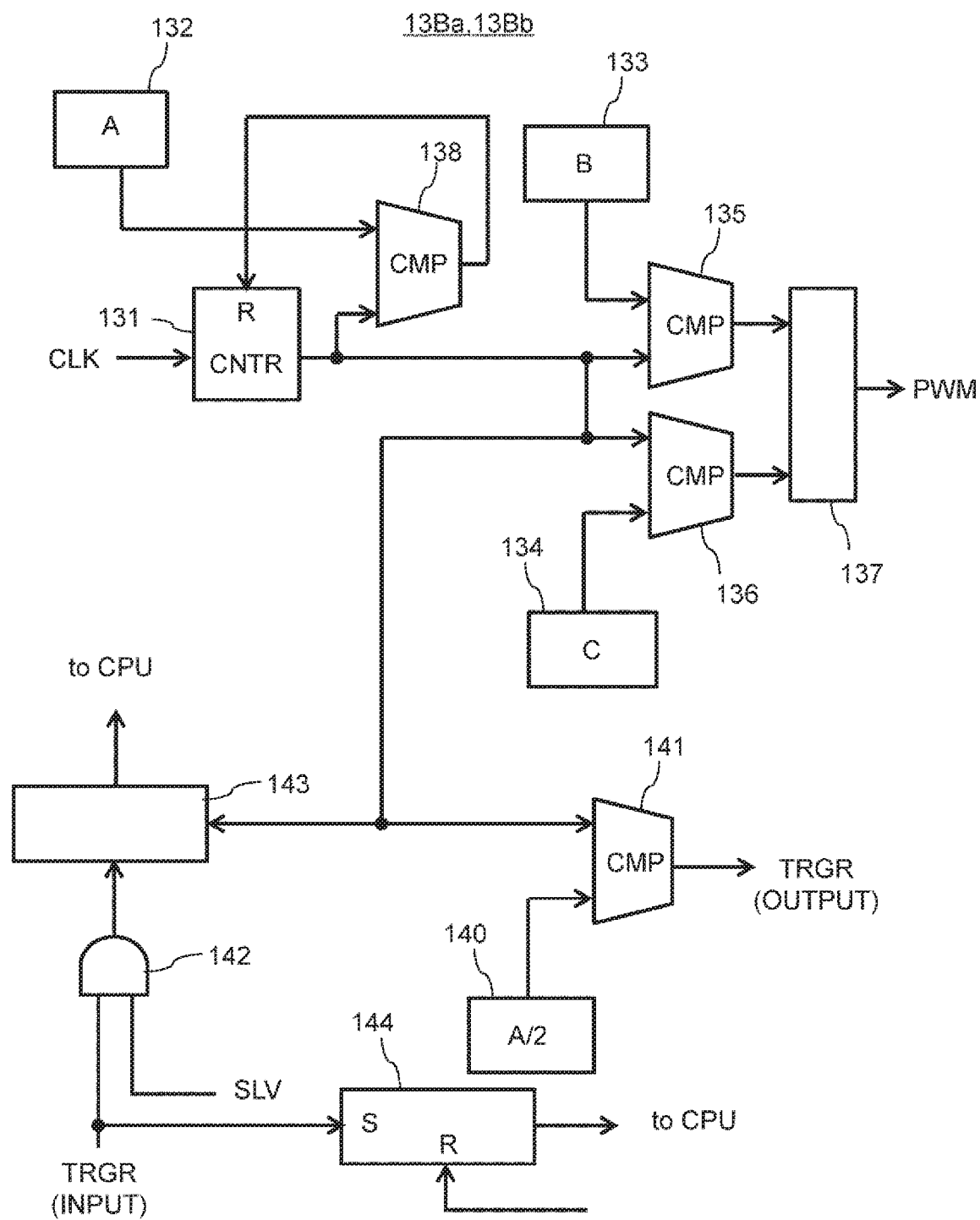
FIG. 23 is a block diagram showing a timer counter unit of FIG. 22.
Figure 24:
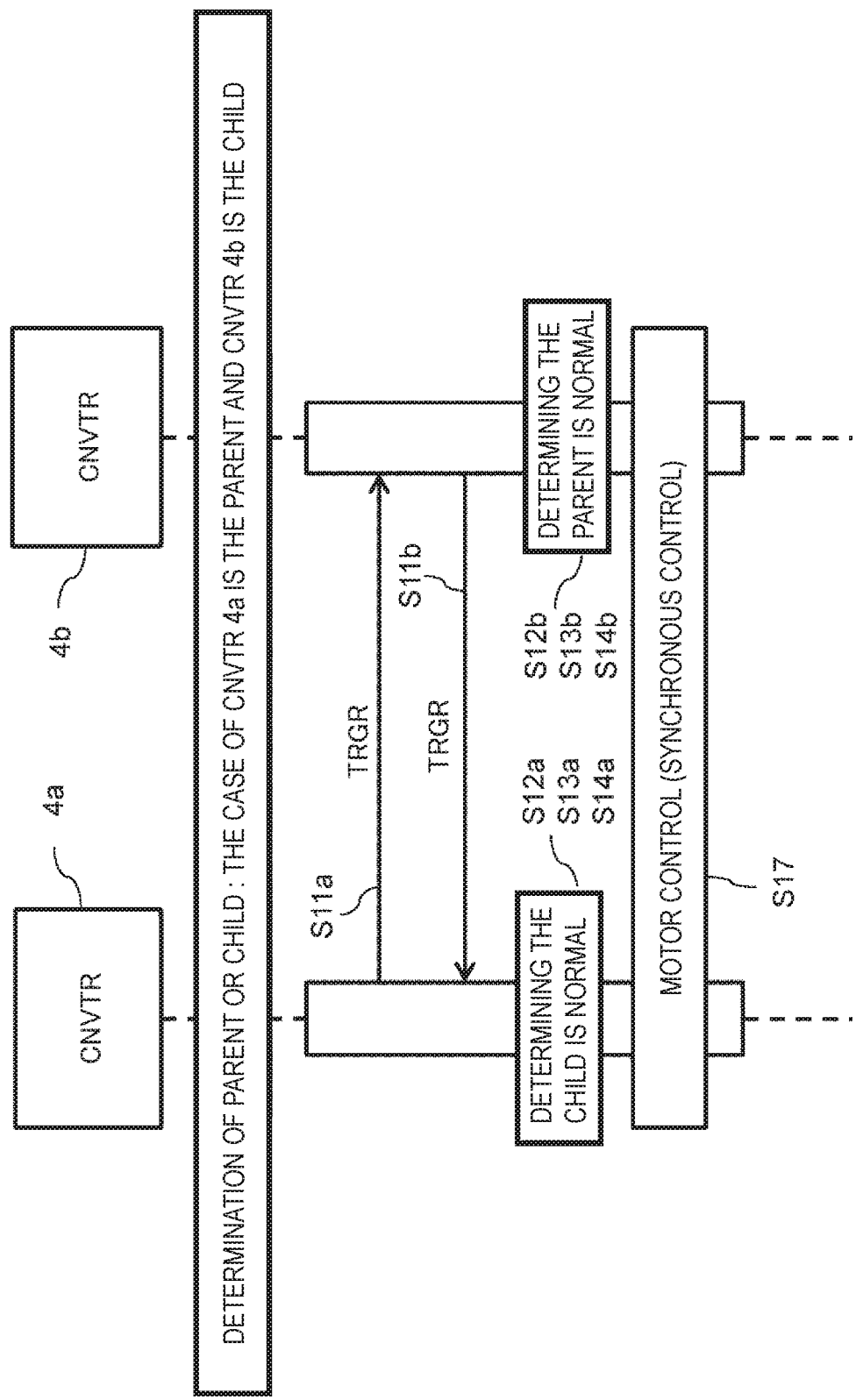
FIG. 24 is a sequence diagram showing normal cases in a mutual monitoring of two power converters.
Figure 25:
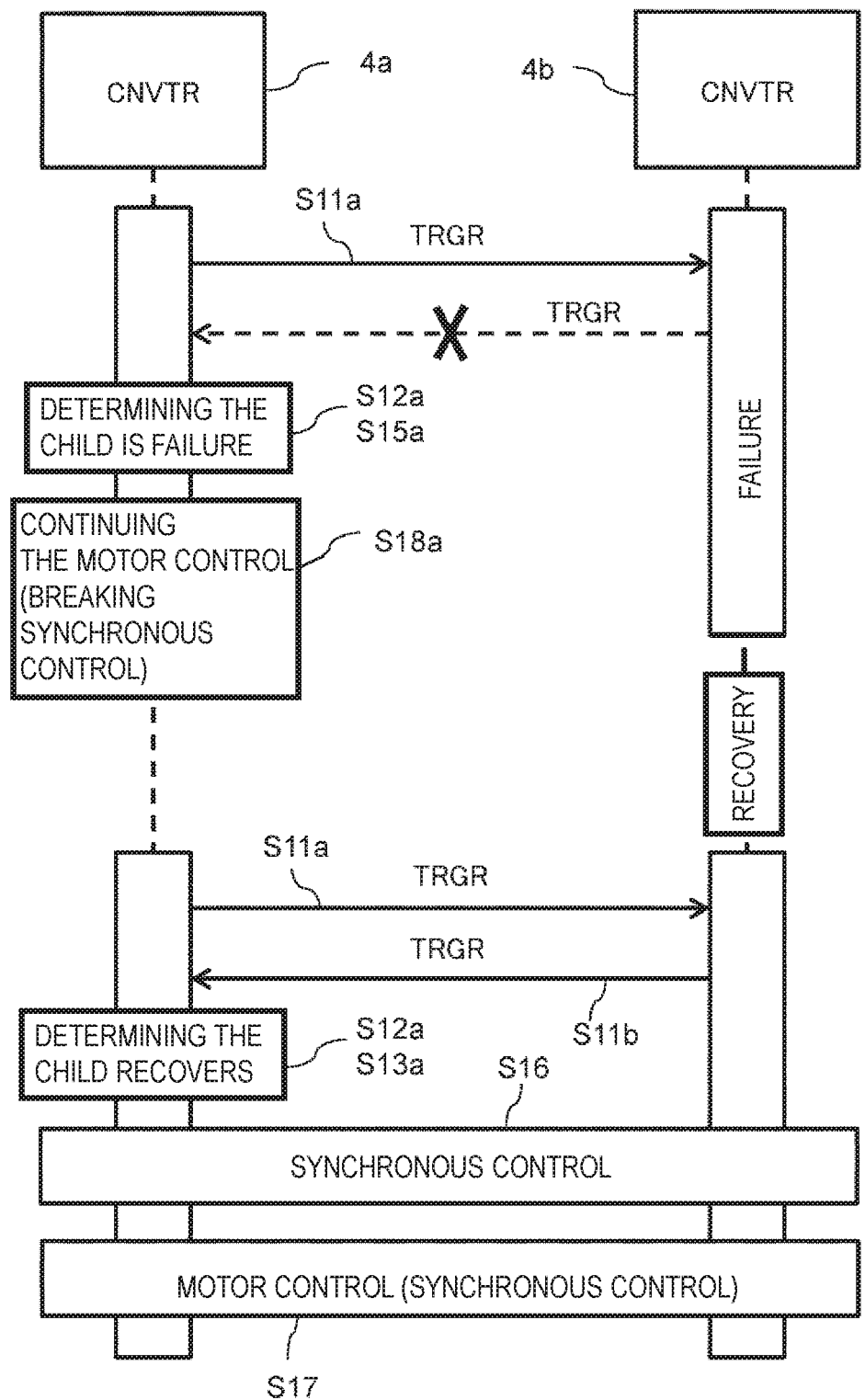
FIG. 25 is a sequence diagram showing a case where a power converter of a child fails in a mutual monitoring of two power converters.
Figure 26:
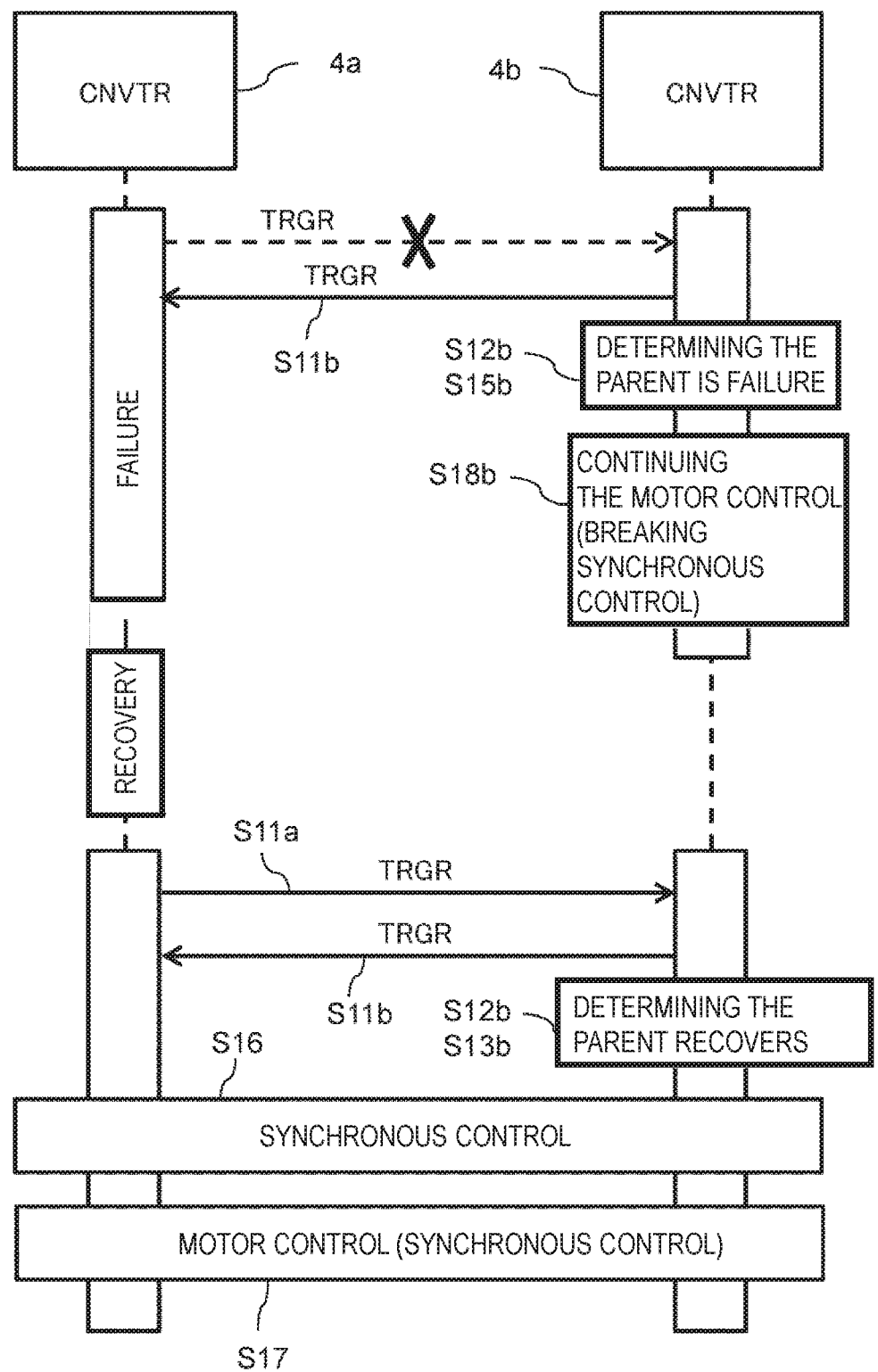
FIG. 26 is a sequence diagram showing a case where a power converter of a parent fails in a mutual monitoring of two power converters.
Figure 27:
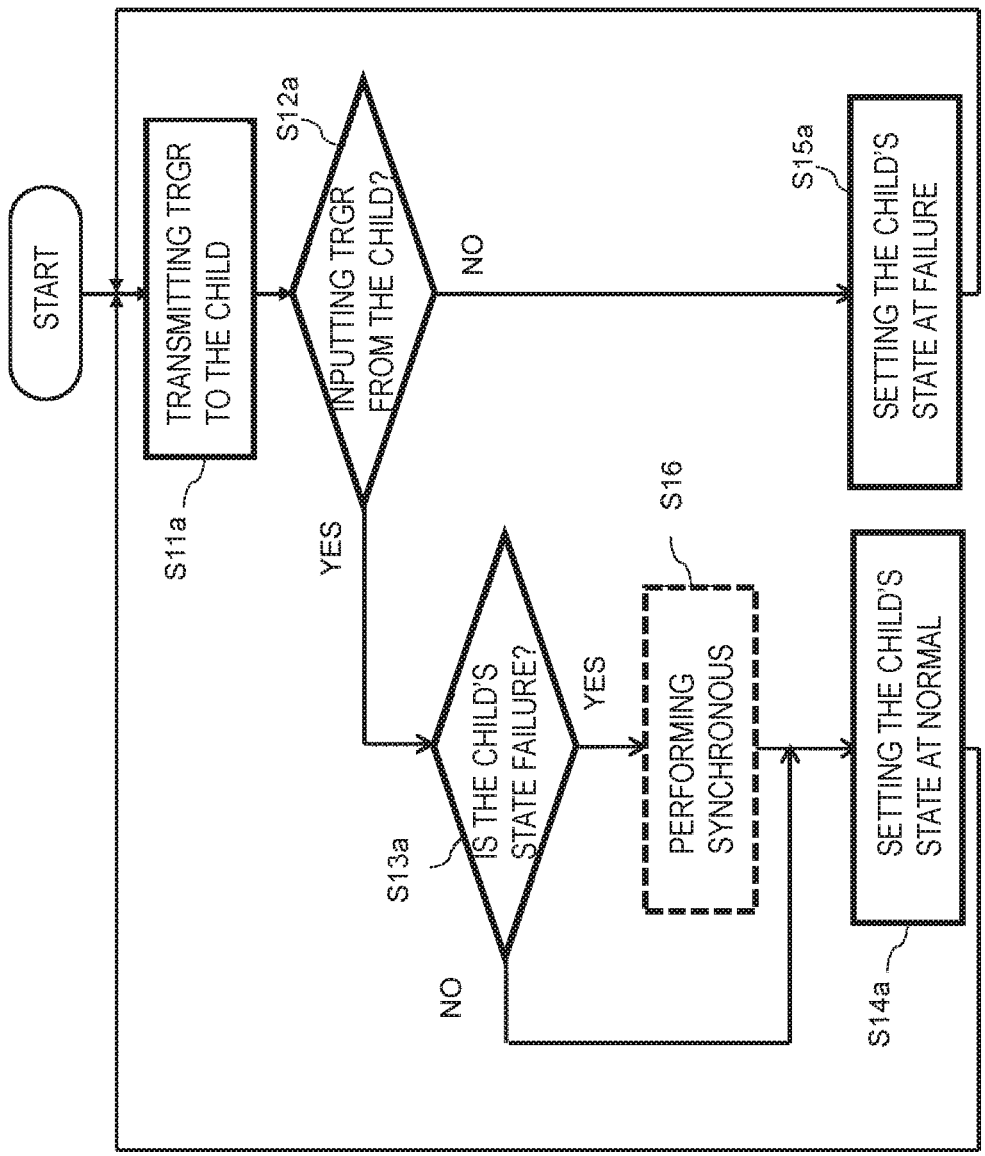
FIG. 27 is a flow chart for a failure monitoring of an MCU of a parent.
Figure 28:
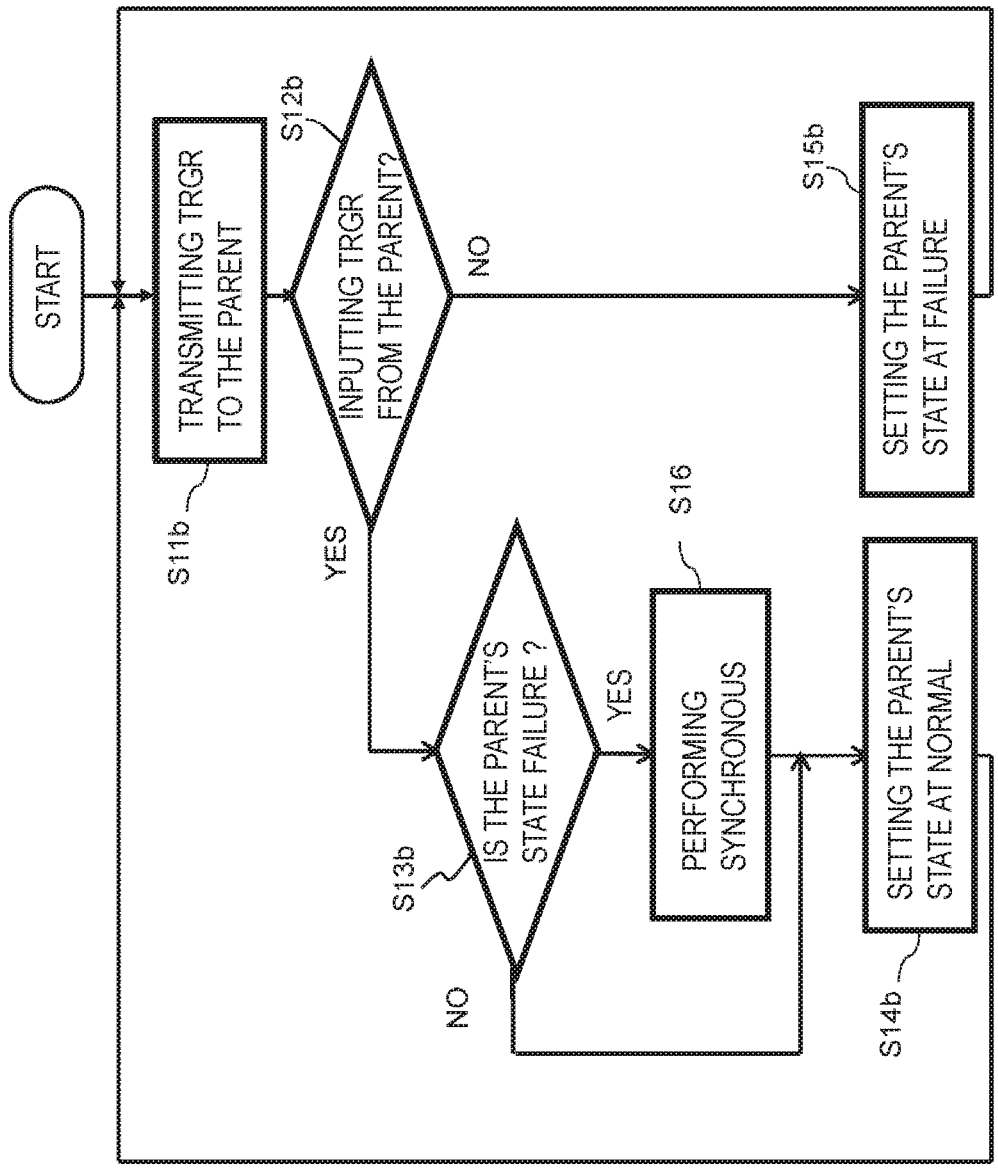
FIG. 28 is a flow chart for a failure monitoring of an MCU of a child.

FIG. 22 is a block diagram showing a configuration of two MCUs of the second modified example. FIG. 23 is a block diagram showing a timer counter unit of FIG. 22. FIG. 24 is a sequential diagram showing a normal situation in the mutual monitoring of the two power converters. FIG. 25 is a sequential diagram showing a situation in which the electronic power converter of a child fails in mutual monitoring of the two power converters and recovers from the failure. FIG. 26 is a sequential diagram showing a situation in which the power converter of a parent fails in mutual monitoring of the two power converters and recovers from the failure. FIG. 27 is a flow chart of fault monitoring of the MCU of the parent. FIG. 28 is a flowchart of the failure monitoring of the MCU of the child.

As shown in FIG. 22, the MCU 1Ba and the MCU 1Bb have the same configuration as the MCU 1a and the MCU 1b of the Embodiment except for the timer counter unit.

As shown in FIG. 23, timer counter units (TCU) 13Ba and 13Bb are provided with registers 144 which are set by trigger signals (TRGR) inputted further in the Embodiment timer counter units (TCU) 13a and 13b. After the CPU reads the contents of the register 144, the register 144 is reset. The portion except for the added register 144 performs the same operation as the Embodiment or the first modified example.

In Embodiment, the MCU of the parent power converter and the MCU of the child power converter periodically transmit a trigger signal (TRGR), while the MCU of the parent ignores the trigger signal from the MCU of the child. In the second modified example, the MCU of the parent power converter and the MCU of the child power converter periodically transmit trigger signal (TRGR) from themselves and receive the other trigger signal (TRGR). If one can receive the trigger signal (TRGR) from the other, the other is determined to be normal, and the motor control (synchronous control) is continued.

As shown in FIG. 24, the power converter (CNVTR 4a) is determined to be a parent and the power converter (CNVTR 4b) is determined to be a child in the parent-child determination of FIG. 6, and it will be described below.

The MCU1Ba of the parental power converter 4a and the MCU1Bb of the child power converter 4b periodically transmit a trigger signal (TRGR) from itself and receive the other trigger signal (TRGR) (steps S11a and S11b).

As shown in FIG. 27, in the MCU1Ba of the parent, the CPU 11a reads out the content of the register 144 to check whether or not there is a trigger signal (TRGR) from the MCU1Bb of the child, and checks whether or not the trigger signal (TRGR) is inputted (step S12a). If there are the trigger signal from the MCU1Bb of the child, the CPU 11a determines that the child power converter 4b is normal. The CPU 11a determines whether or not a failure is set in a register (not shown) in which the state of the MCU1Bb of the child is set (step S13a). If the fault is not set, the CPU 11a sets normal to a register (not shown) in which the status of the child electronic power converter 4b is set (step S14a).

As shown in FIG. 28, in the MCU1Bb of the child, the CPU 11b reads the content of the register 144 to check whether or not the trigger signal (TRGR) is inputted from the MCU1Ba of the parent (step S12b). If there is a TRGR from the MCU1Ba of the parent, the CPU 1ib determines that the parent power converter 4a is normal. The CPU 1ib determines whether a fault has been set in a register (not shown) in which the state of the MCU1Ba of the parent is set (step S13b). If the fault is not set, the CPU 1ib sets the register (not shown) in which the status of the parent power converter 4a is normal (step S14b).

If one is unable to receive TRGR from the other, the other is determined to be faulty. For example, as shown in FIG. 25, when the MCU 1Ba of the parent (power converter CNVTR 4a) cannot receive the trigger signal (TRGR) from the child (power converter CNVTR 4b), the MCU 1Ba of the parent determines that the MCU1Bb of the child has failed. As shown in FIG. 27, when there are no trigger signals from the MCU1Bb of the child, the CPU 11a determines that the child power converter 4b has failed, and sets the failure in a register (not shown) in which the status of the child power converter 4b is set (step S15a). The MCU1Ba of the parent continues to control the motor, to transmit the trigger signal (TRGR) to the MCU 1Bb to the child, and to determine whether or not the trigger signal (TRGR) sent from the MCU1Bb of the child is received, but does not perform the synchronization control for adjusting the deviation of the start timings of the counts of the counters 131 (step S18a).

Thereafter, if the power converter 4b is recovered, a trigger signal (TRGR) from the MCU 1Bb of the child is inputted, so that the CPU 11a determines that the power converter 4b is normal in the step S12a of FIG. 27. When the failure is recovered, since the failure is set in the register in which the status of the child power converter 4b is set, the CPU 11a determines in step S13a that the child power converter 4b is recovered. The MCU1Bb of the child adjusts the deviation of the start timing of the count of the counter 131 (step S16), and then restarts the motor control (synchronous control) (step S17).

Further, as shown in FIG. 26, when the MCU 1Bb of the child cannot receive the trigger signal (TRGR) from the MCU 1Ba of the parent, the MCU1Bb of the child is determined to be the failure of the parent power converter 4a. As shown in FIG. 28, when there is no trigger signal (TRGR) from the MCU 1Ba of the parent, the CPU 11b determines that the parent power converter 4a has failed, and sets the failure in a register (not shown) in which the state of the parent power converter 4a is set (step S15b). The MCU 1Bb of the child continues the motor control and the determination as to whether or not the trigger signal (TRGR) transmitted from the MCU 1Ba of the parent is received, but does not perform the synchronization control for adjusting the deviation of the start timing of the counting of the counter 131 (step S18b).

Thereafter, if the parent power converter 4a is recovered, since the trigger signal (TRGR) from the MCU 1Ba of the parent is inputted, the CPU 11b determines that the parent power converter 4a is normal in step S12b of FIG. 28, and if it is recovered from the failure, the CPU 11b determines that the parent power converter 4a is recovered in step S13b because the failure is set in the register in which the state of the parent power converter 4a is set. The MCU 1Bb of the child adjusts the deviation of the start timing of the count of the counter 131 (step S16), and then restarts the motor control (synchronous control) (step S17).

In the second modified example, since the failure and recovery of the power converter of the other can be monitored by the mutual monitoring, it is possible to recover to the control of the electric motor by the two power converter after one of the two power converter recovers from the failure.

Third Modified Example

Figure 29:
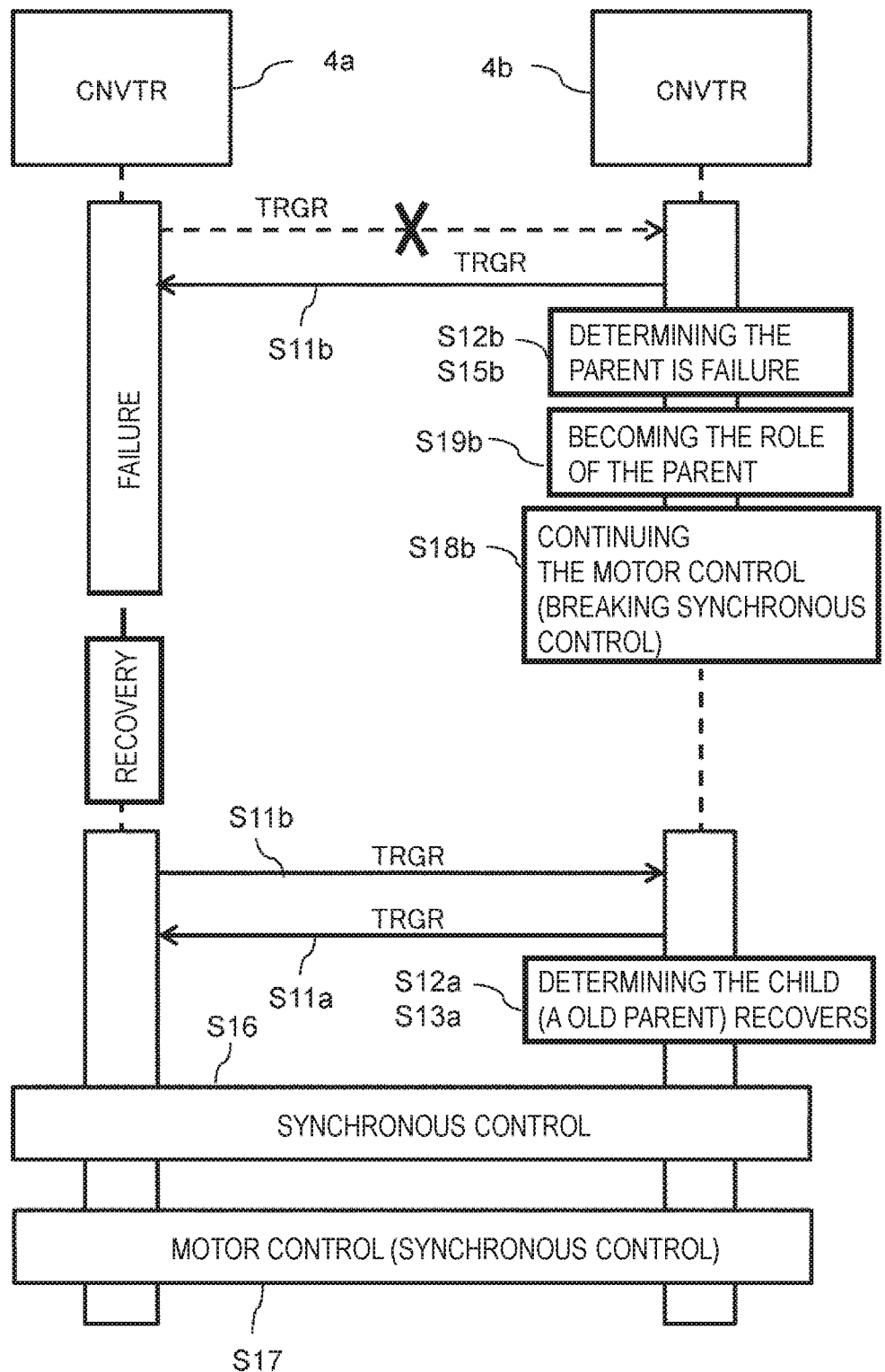
FIG. 29 is a sequential diagram showing a failure of a power converter 4a of a parent in mutual monitoring of two power converters of a third modification example.
Figure 30:
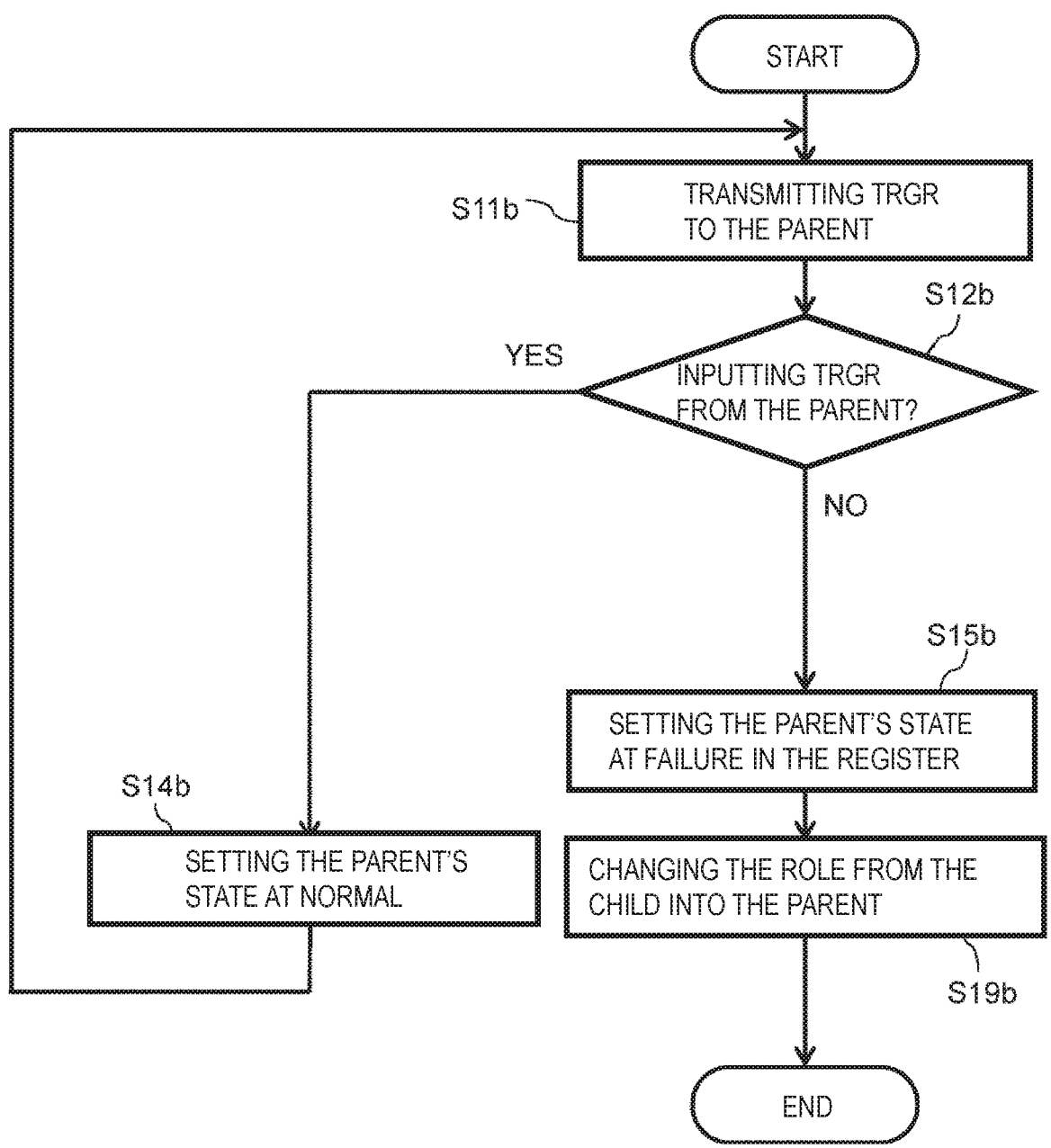
FIG. 30 is a flow chart for a failure monitoring of an MCU of a child.

In the third modified example, when the child power converter determines that the parent power converter fails, the child power converter newly changes the parent power converter, and will be described with reference to FIGS. 29 and 30. FIG. 29 is a sequential diagram showing a situation in which the parent power converter fails in mutual monitoring of the two power converters and recovers from the failure. FIG. 30 is a flowchart of a failure monitoring of the MCU of the child.

The configuration of the MCU 1Ba and the MCU 1Bb of the third modified example is the same as that of the second modified example, and the operation of mutual monitoring in the normal state is the same as that of the second modified example.

As shown in FIG. 29, if the MCU 1Bb of the child is unable to receive the TRGR from the MCU 1Ba of the parent, the MCU 1Bb of the child determines to be a failure of the parent power converter 4a. As shown in FIG. 30, when there is no trigger signal (TRGR) from the parent MCU 1Ba, the CPU lib determines that the parent power converter 4a has failed, and sets the failure in a register (not shown) in which the status of the parent power converter 4a is set (step S15b). The power converter 4b becomes the parent and the power converter 4a becomes the child (step S19b). Thereafter, the MCU 1Bb monitors according to the fault determination flow chart executed by the parents in FIG. 27. The MCU 1Bb continues the motor control as a parent and the reception/non-reception determination of the trigger signal (TRGR) transmitted from the MCU 1Ba of the child (old parent), but does not perform the synchronization control for adjusting the deviation of the start timing of the counting of the counter 131 (step S18b).

Thereafter, if the power converter 4a of the child (old parent) is recovered, since the trigger signal (TRGR) from the MCU 1Ba of the child (old parent) is inputted, the CPU 11b determines that the power converter 4a of the child (old parent) is normal in the step S12a of FIG. 27. When the power converter 4a (old parent) recovers from the failure, since the failure is set in the register in which the state of the power converter 4a of the child (old parent) is set, the CPU 11b determines that the power converter 4a of the child (old parent) recovers in the step S13a. When a failure is set in the register, the MCU 1Ba of the child (old parent) adjusts the deviation of the start timing of the counting of the counter 131 (step S16), and then restarts the motor control (synchronous control) (step S17). At this time, since the MCU 1Ba of the child (old parent) adjusts the deviation of the start timing of the count of the counter 131, the start timing of the count of the counter 131 of the MCU 1Bb of the parent (old child) does not change.

As shown in FIG. 30, when there is a trigger signal (TRGR) from the MCU 1Ba of the parent, the CPU 11b determines that the parent power converter 4a is normal. Unlike the second modified example, the CPU lib sets normal a register (not shown) in which the state of the parent power converter 4a is set without determining whether a failure is set in a register (not shown) in which the state of the parent power converter 4a is set (step S14b). This is the reason why, when the power converter 4a recovers and the MCU 1Ba starts transmitting the TRGR, the power converter 4a is not the parent but the child.

The parent-child relation of the two power converters can be made variable.

Although the invention made by the present inventor has been specifically described based on the embodiments, the Embodiments, the modified example, and the application examples, it is needless to say that the present invention is not limited to the above-described embodiments, the Embodiment, the modified example, and the application examples, and the present invention can be variously modified.

For example, in the embodiment and the like, the counter for counting up is described as an example, but a counter for counting down may be used.

In the first modified example, the synchronization is performed by the first method of the embodiment, but the synchronization may be performed by the second method.

In the second modified example, the two control units are supplied with clock signals from the same clock generator, but the two control units may be supplied with clock signals from different clock generators.

What is claimed is:

1. A semiconductor device comprising:
a first device having a first counter for periodically counting a clock number of a supplied clock signal to a first predetermined value, generating and outputting a first control signal using a count value of the first counter, a second predetermined value and a third predetermined value, and outputting a first trigger signal when the count value of the first counter reaches a fourth predetermined value; and
a second device having a second counter for periodically counting a clock number of a supplied clock signal to the first predetermined value and generating and outputting a second control signal using a count value of the second counter, the second predetermined value and the third predetermined value,
wherein the second device is configured to determine a difference between the count value of the first counter and the count value of the second counter when the first trigger signal is inputted, and to adjust a count period of the second counter based on the difference or to adjust the second predetermined value and the third predetermined value for the second counter.

2. The semiconductor device according to claim 1, wherein the second device is configured to calculate a time difference between start timings of counting of the first counter and the second counter based on the difference, and to adjust a time until the count value of the second counter reaches the first predetermined value to the time until the count value of the first counter reaches the first predetermined value.

3. The semiconductor device according to claim 2, wherein the second device is configured to adjust a period of clocks supplied based on the difference.

4. The semiconductor device according to claim 1, wherein the second device further comprises:
a second register for storing the second predetermined value; and
a third register for storing the third predetermined value, wherein the second device is configured to rewrite the content of the second register and the content of the third register based on the difference to synchronize the output timings of the first control signal output by the first device and the second control signal output by the second device.

5. The semiconductor device according to claim 1, wherein when the difference exceeds a predetermined value, the second device is configured to adjust the count period of the second counter based on the difference or to adjust the second predetermined value and the third predetermined value for the second device based on the difference.

6. The semiconductor device according to claim 1, wherein the second device further comprises:
a first register for storing the first predetermined value;
a second register for storing the second predetermined value;
a third register for storing the third predetermined value;
a first comparator for comparing the count value of the second counter with a content of the first register;
a second comparator for comparing the count value of the second counter with a content of the second register;
a third comparator for comparing the count value of the second counter with a content of the third register;
a circuit for generating the second control signal based on the outputs of the second comparator and the third comparator; and
a fourth register for storing the count value of the second counter based on the first trigger signal outputted from the first device.

7. A control device comprising:
a first control unit having a first counter for periodically counting the number of clocks of a clock signal to be supplied to a predetermined value, generating a first PWM signal based on a count value of the first counter and supplying the first PWM signal to a first drive circuit to control a drive of the motor, and
a second control unit having a second counter for periodically counting the number of clocks of a clock signal to be supplied to the predetermined value, generating a second PWM signal based on a count value of the second counter and supplying the second PWM signal to a second drive circuit to control the drive of the motor,
wherein
the first control unit transmits a first trigger signal to the second control unit when the count value of the first counter reaches a predetermined value, and
the second control unit determines a difference between the count value of the second counter when the first trigger signal is received and the count value of the first counter, and adjusts a count period of the second counter based on the difference to synchronously control the second PWM signal with the first PWM signal or adjusts the count value of the second counter to generate the second PWM signal to synchronously control the second PWM signal with the first PWM signal.

8. The control device according to claim 7, wherein the clock signal supplied to the first control unit and the clock signal supplied to the second control unit are signals from the same clock generator.

9. The control device according to claim 7, wherein the second control unit is configured to perform control to synchronize the second PWM signal with the first PWM signal when the difference is greater than a predetermined threshold.

10. The control device according to claim 7, comprising:
a first control device comprising the first control unit; and
a second control device comprising the second control unit,
wherein the first control unit transmits the first trigger signal to the second control unit, and
wherein the second control unit set the first control device as faulty in a register if the first trigger signal is not received.

11. The control device according to claim 10, wherein the second control unit does not perform synchronous control with the first control unit if the first trigger signal is not received.

12. The control device according to claim 10, wherein the second control unit transmits a second trigger signal to the first control unit when a count value of the second counter reaches a predetermined value, and
wherein the first control unit determines a difference between a count value of the second counter and a count value of the first counter when the second trigger signal is received when a failure is set in the register, adjusts a count period of the first counter to synchronously control the first PWM signal with the second PWM signal based on the difference, or adjusts a count value of the first counter to generate the first PWM signal to synchronously control the first PWM signal with the second PWM signal.

13. A control method of a device comprising the steps of:
periodically counting a clock number of a clock signal to be supplied to a predetermined value by a first counter in a first control unit;
generating a first PWM signal based on a count value of the first counter in the first control unit;
supplying the first PWM signal to a first drive circuit to control a drive of an electric motor;
periodically counting a clock number of a clock signal to be supplied to the predetermined value by a second counter in a second control unit;
generating a second PWM signal based on a count value of the second counter in the second control unit;
supplying the second PWM signal to a second drive circuit to control the drive of the electric motor;
transmitting a first trigger signal to the second control unit when the count value of the first counter reaches a predetermined value in the first control unit;
determining a difference between the count value of the second counter when the first trigger signal is received and the count value of the first counter in the second control unit; and
synchronizing the second PWM signal with the first PWM signal by adjusting a count period of the second counter based on the difference, or
synchronizing the second PWM signal with the first PWM signal by adjusting a count value of the second counter for generating the second PWM signal.

14. The control method according to claim 13, wherein the second control unit synchronizes the second PWM signal with the first PWM signal when the difference is larger than a predetermined threshold.

15. The control method according to claim 13, further comprising the steps of:
setting a first control device including the first control unit in a register as faulty if the first trigger signal is not received by the first control unit.

16. The control method according to claim 15, further comprising the steps of:
not performing synchronization control with the first control unit by the second control unit when the first trigger signal cannot be received by the second control unit, and
thereafter resuming synchronization control with the first control device by the second control unit if the first trigger signal is received by the second control unit.

17. The control method according to claim 15, further comprising the steps of:
transmitting a second trigger signal to the first control unit from the second control unit when the count value of the second counter reaches a predetermined value;
determining a difference between the count value of the first counter when the second trigger signal is received when a failure is set in the register and the count value of the second counter in the first control unit, and
adjusting the count period of the first counter based on the difference to synchronously control the first PWM signal with the second PWM signal, or
adjusting the count value of the first counter to generate the first PWM signal to synchronously control the first PWM signal with the second PWM signal.

* * * * *